(12) United States Patent
Koyama et al.

(10) Patent No.: US 9,331,689 B2
(45) Date of Patent: May 3, 2016

(54) POWER SUPPLY CIRCUIT AND SEMICONDUCTOR DEVICE INCLUDING THE SAME

(71) Applicant: Semiconductor Energy Laboratory Co., Ltd., Atsugi-shi, Kanagawa-ken (JP)

(72) Inventors: Jun Koyama, Sagamihara (JP); Junichiro Sakata, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 421 days.

(21) Appl. No.: 13/865,407

(22) Filed: Apr. 18, 2013

(65) Prior Publication Data

US 2013/0285470 A1 Oct. 31, 2013

(30) Foreign Application Priority Data

Apr. 27, 2012 (JP) ................................ 2012-102126

(51) Int. Cl.
*H02H 7/00* (2006.01)
*H03K 17/56* (2006.01)
*H03K 19/00* (2006.01)
*H02M 7/217* (2006.01)
*H03K 17/06* (2006.01)
*H02M 1/00* (2006.01)

(52) U.S. Cl.
CPC .............. *H03K 17/56* (2013.01); *H02M 7/217* (2013.01); *H03K 19/0013* (2013.01); *H02M 2001/0006* (2013.01); *H03K 17/063* (2013.01); *Y10T 307/74* (2015.04)

(58) Field of Classification Search
USPC ............................................ 307/112; 361/18
See application file for complete search history.

(56) References Cited

U.S. PATENT DOCUMENTS

| | | |
|---|---|---|
| 5,714,869 A | 2/1998 | Tamechika et al. |
| 5,731,732 A | 3/1998 | Williams |
| 5,731,856 A | 3/1998 | Kim et al. |
| 5,744,864 A | 4/1998 | Cillessen et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 7, 2004, vol. 85, No. 13, pp. 2541-2543.

(Continued)

*Primary Examiner* — Danny Nguyen
(74) *Attorney, Agent, or Firm* — Robinson Intellectual Property Law Office; Eric J. Robinson

(57) ABSTRACT

A power supply circuit includes a first switch, a voltage regulator circuit connected to the first switch, and a control circuit for controlling the first switch. The control circuit includes a second switch, a third switch, and a voltage generation circuit. For controlling the first switch, first voltage output from the voltage generation circuit is applied to the first switch through the second switch, and second voltage output from the voltage generation circuit is applied to the first switch through the third switch. Power consumption of the power supply circuit can be reduced.

17 Claims, 13 Drawing Sheets

(56) References Cited

U.S. PATENT DOCUMENTS

| | | |
|---|---|---|
| 6,111,321 A | 8/2000 | Agarwala |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,719,235 B2 | 5/2010 | Sano et al. |
| 7,732,619 B2 | 6/2010 | Egawa et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0166967 A1 | 7/2007 | Ichinose et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0001184 A1 | 1/2008 | Genrikh et al. |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0142795 A1 | 6/2008 | Ichinose et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0001384 A1 | 1/2009 | Kosaki et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0231021 A1 | 9/2009 | Koyama et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0085081 A1 | 4/2010 | Ofuji et al. |
| 2010/0092800 A1 | 4/2010 | Itagaki et al. |
| 2010/0109002 A1 | 5/2010 | Itagaki et al. |
| 2011/0068852 A1 | 3/2011 | Yamazaki et al. |
| 2011/0181349 A1 | 7/2011 | Yamazaki et al. |
| 2011/0254523 A1* | 10/2011 | Ito et al. .............. 323/282 |
| 2012/0140523 A1* | 6/2012 | Takahashi et al. ........... 363/16 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 09-121470 A | 5/1997 |
| JP | 11-008933 A | 1/1999 |
| JP | 11-505377 | 5/1999 |
| JP | 2000-044236 A | 2/2000 |
| JP | 2000-150900 A | 5/2000 |
| JP | 2001-251772 A | 9/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-200817 A | 8/2007 |
| JP | 2007-228724 A | 9/2007 |
| JP | 2009-004733 A | 1/2009 |
| JP | 2009-010142 A | 1/2009 |
| WO | WO-2004/114391 | 12/2004 |
| WO | WO-2008/143304 | 11/2008 |

OTHER PUBLICATIONS

Dembo.H et al., "RFCPUS on Glass and Plastic Substrates Fabricated by TFT Transfer Technology,", IEDM 05: Technical Digest of International Electron Devices Meeting. Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers. 2004, vol. 35, pp. 860-863.

Nomura.K et al., "Room-Temperature Fabrication of Transparent Flexible Thin-Film Transistors using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar

(56) References Cited

OTHER PUBLICATIONS

Plasma Treatment,", Appl. Phys. Lett. (Applied Physics Letters), Jun. 29, 2007, vol. 90, No. 26, pp. 262106-1-262106-3.
Takahashi.M et al., "Theorectical Analysis of IGZO Transparent Amorphous Oxide Semiconductor,", IDW '08 : Proceedings of the 15th International Display Workshops, Dec. 3, 2008, pp. 1637-1640.
Hayashi.R et al., "42.: Invited Paper: Improved Amorphous In—Ga—Zn—O TFTS,", SID Digest '08 : SID International Symposium Digest of Technical Papers, May 20, 2008, vol. 39, pp. 621-624.
Prins.M et al., "A Ferroelectric Transparent Thin-Film Transistor,", Appl. Phys. Lett. (Applied Physics Letters) , Jun. 17, 1996, vol. 68, No. 25, pp. 3650-3652.
Nakamura.M et al., "The phase relations in the InO3—Ga2ZnO4—ZnO system at 1350° C.,", Journal of Solid State Chemistry, Aug. 1, 1991, vol. 93, No. 2, pp. 298-315.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor,", Science, May 23, 2003, vol. 300, No. 5623, pp. 1269-1272.
Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.
Asakuma.N et al., "Crystallization and Reduction of SOL-GEL-Derived Zinc Oxide Films by Irradiation with Ultraviolet Lamp,", Journal of SOL-GEL Science and Technology, 2003, vol. 26, pp. 181-184.
Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.
Li.C et al., "Modulated Structures of Homologous Compounds InMO3(ZnO)m (M=In, Ga; m=Integer) Described by Four-Dimensional Superspace Group,", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.
Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.
Nowatari.H et al., "60.2: Intermediate Connector with Suppressed Voltage Loss for White Tandem OLEDS,", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 as a Charge-Generation Later,", Adv. Mater. (Advanced Materials), 2006, vol. 18, No. 3, pp. 339-342.
Tsuda.K et al., "Ultra Low Power Consumption Technologies for Moblie TFT-LCDs ,", IDW '02 : Proceedings of the 9th International Display Workshops, Dec. 4, 2002, pp. 295-298.
Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Drive by Indium—Gallium—Zinc Oxide TFTs Array,", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure,", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems,", Journal of Solid-State Circuits , 2008, vol. 43, No. 1, pp. 292-299.
Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.
Lee.M et al., "15.4:Excellcent Performance of Indium—Oxide-Based Thin-Film Transistors by DC Sputtering,", SID Digest '09: SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.
Sakata.J et al., "Development of 4.0-In. AMOLED Display with Driver Circuit Using Amorphous In—Ga—Zn—Oxide TFTS,", IDW '09 : Proceedings of the 16th International Display Workshops, 2009, pp. 689-692.
Park.J et al., "Amorphous Indium—Gallium—Zinz Oxide TFTS and their Application for Large Size AMOLED,", AM-FPD '08 Digest of Technical Papers, Jul. 2, 2008, pp. 275-278.
Park.S et al., "Challenge to Future Displays: Transparent AM-OLED Drived by Peald Grown ZnO TFT,", IMID '07 Digest, 2007, pp. 1249-1252.
Godo.H et al., "Temperature Dependence of Characteristics and Electronic Structure fo Amorphous In—Ga—Zn—Oxide TFT,", AM-FPD '09 Digest of Technical Papers, Jul. 1, 2009, pp. 41-44.
Osada.T et al., "Development of Driver-Integrated Panel using Amorphous In—Ga—Zn—Oxide TFT,", AM-FPD '09 Digest of Technical Papers, Jul. 1, 2009, pp. 33-36.
Hirao.T et al., "Novel Top-Gate Zinc Oxide Thin-Film Transistors (ZnO TFTS) for AMLCDS,", Journal of the SID, 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.
Ohara.H et al., "21.3:4.0 In. QVGA AMOLED Display using In—Ga—Zn—Oxide TFTS with a Novel Passivation Layer,", SIG Digest '09 : SID International Symposium Digest of Technical Papers, May 31, 2009, pp. 284-287.
Miyasaka.M "SUFTLA Flexible Microelectronics on their Way to Business,", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

(56) References Cited

OTHER PUBLICATIONS

Asaoka.Y et al., "29.1:Polarizer-Free Reflective LCD Combined with Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel YbFe2O4 and Yb2Fe3O7 Types of Structure for Compounds in the In2O3 and Sc2O3—A2O3—BO Systems [A;Fe, Ga, or Al; B: Mg, Mn, Fe, Ni, Cu or Zn] at Temperatures over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08: SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122103-3.

Oba.F et al., "Defect Energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods using CASTEP,", Zeitschrift fur Kristallographie, 2005, vol. 220, pp. 567-570.

Lany.S et al., "Dopability, Intrinsic Conductivity and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors with Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor of SrTiO3 with Sputtered Al2O3 Gate Insulator,", Appl. Phys. Lett. (Applied Physics Letters) , Sep. 1, 2003, vol. 83, No. 9, pp. 1755-1757.

\* cited by examiner

POWER SUPPLY CIRCUIT AND SEMICONDUCTOR DEVICE INCLUDING THE SAME

BACKGROUND OF THE INVENTION

1. Field of the Invention

The present invention relates to power supply circuits including transistors as switches and semiconductor devices including the power supply circuits.

2. Description of the Related Art

A power supply circuit (also referred to as a power conversion circuit) has a function of regulating voltage supplied from a battery or a power supply such as a commercial power supply in accordance with the specification of a load. For example, voltage supplied from a commercial power supply is AC voltage having an effective value of 100 Vrms. In contrast, voltage needed in a commonly-used electronic device is a comparatively low DC voltage of 5 V, 12 V, or the like in many cases. In that case, voltage output from a power supply is rectified and stepped down by a power supply circuit and then supplied to a load.

In general, a power supply circuit includes a circuit regulating voltage, such as a rectifier circuit, a smoothing circuit, or a converter, and a switch that is formed using a semiconductor element such as a transistor and has a function of controlling electrical connection between a power supply and a load. Unlike a mechanical switch, a semiconductor switch formed using a semiconductor element has advantages of high reliability, long lifetime, and high-speed switching. Note that in the case where the power supply circuit includes the semiconductor switch, it is necessary to provide a control circuit for controlling the operation of the transistor in the power supply circuit, and voltage regulated in the circuit is supplied not only to the load but also to the control circuit.

Patent Document 1 discloses a stabilized power supply in which a battery is connected to an electronic circuit that is a load through an electronic switch to which a system control circuit is connected.

REFERENCE

[Patent Document 1] Japanese Published Patent Application No. 11-008933

SUMMARY OF THE INVENTION

Even when a semiconductor switch (hereinafter simply referred to as a switch) controlling electrical connection between a power supply and a load is off, it is necessary to supply voltage regulated in a power supply circuit to the control circuit. Thus, the switch is provided not between a circuit regulating voltage and the power supply but between the circuit regulating voltage and the load.

However, when the switch is provided between the circuit regulating voltage and the load, voltage output from the power supply is always applied to the circuit regulating voltage. Thus, even when the switch is off, that is, even when voltage is not supplied to the load, the circuit regulating voltage is always in an operating state only to supply voltage to the control circuit, so that power is consumed.

In particular, in the case where the power consumption of the load is high, in order to improve the current capability or withstand voltage of a semiconductor element in the circuit regulating voltage, the size of the semiconductor element tends to be increased. Thus, in the circuit regulating voltage, the capacitance of the semiconductor element, a wiring, or the like is inevitably increased, so that power consumed by charging and discharging of the capacitance at the time of operating the circuit regulating voltage becomes too high to ignore.

With the technical background, an object of one embodiment of the present invention is to provide a power supply circuit whose power consumption can be reduced. An object of one embodiment of the present invention is to provide a semiconductor device that includes the power supply circuit and can have low power consumption.

A power supply circuit according to one embodiment of the present invention includes a switch between a power supply and a circuit having a function of regulating voltage (hereinafter also referred to as a voltage regulator). In addition, a control circuit controlling the operation of the switch has a function of temporarily storing power supplied from the voltage regulator and a function of keeping the operating state of the switch.

First, the function of temporarily storing power supplied from the voltage regulator is described. In one embodiment of the present invention, since the switch is provided between the voltage regulator and the power supply, supply of voltage from the power supply to the voltage regulator is stopped when the switch is turned off. Accordingly, supply of voltage from the voltage regulator to the control circuit is also stopped. However, in one embodiment of the present invention, by provision of an electric storage device having a function of temporarily storing power supplied from the voltage regulator in the control circuit, even when supply of voltage from the voltage regulator to the control circuit is stopped, the control circuit can be operated using voltage output from the electric storage device. Further, in one embodiment of the present invention, when power is not supplied to a load, the switch is turned off, so that supply of voltage to the voltage regulator can be stopped. Accordingly, it is possible to prevent power consumption due to charging and discharging of the capacitance of the voltage regulator. In other words, in one embodiment of the present invention, the power consumption of the power supply circuit can be reduced while the control circuit is operated.

Note that in one embodiment of the present invention, when the amount of power that can be output from the electric storage device is insufficient, an auxiliary power supply that can compensate power needed for the operation of the control circuit may be provided.

Next, the function of keeping the operating state of the switch is described. In one embodiment of the present invention, by applying voltage for determining the operating state of the switch from the control circuit to the switch, the switch is turned on or off. In addition, in one embodiment of the present invention, in order to keep the state where the voltage is applied to the switch, another switch formed using a transistor with extremely low off-state current is provided in the control circuit. In other words, in one embodiment of the present invention, the switch formed using a transistor with extremely low off-state current has a function of keeping the operating state of the switch provided between the voltage regulator and the power supply. With this structure, even when generation of voltage for determining the operating state of the switch provided between the voltage regulator and the power supply is stopped in the control circuit, it is possible to keep the operating state of the switch.

Specifically, a power supply circuit according to one embodiment of the present invention includes a first switch; a first circuit (a voltage regulator) regulating first voltage applied from a power supply through the first switch; an electric storage device storing power using the first voltage regulated in the first circuit; an auxiliary power supply; a second circuit (a voltage generation circuit) generating third voltage for turning on the first switch and fourth voltage for turning off the first switch using second voltage output from the electric storage device or the auxiliary power supply; an input device; a second switch having a function of supplying the third voltage to the first switch when the second switch is on and having a function of holding the third voltage supplied to the first switch when the second switch is off; a third switch having a function of supplying the fourth voltage to the first switch when the third switch is on and having a function of holding the fourth voltage supplied to the first switch when the third switch is off; and a third circuit (a level shifter) generating a signal for turning on or off the second switch and the third switch by regulating voltage of a signal from the input device with the use of the third voltage and the fourth voltage.

According to one embodiment of the present invention, it is possible to provide a power supply circuit whose power consumption can be reduced. Further, according to one embodiment of the present invention, it is possible to provide a semiconductor device that includes the power supply circuit and can have low power consumption.

BRIEF DESCRIPTION OF THE DRAWINGS

In the accompanying drawings.

DETAILED DESCRIPTION OF THE INVENTION

Embodiments of the present invention will be described in detail below with reference to the drawings. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiments.

Note that one embodiment of the present invention includes, in its category, all the semiconductor devices that can include power supply circuits: for example, integrated circuits, RF tags, and semiconductor display devices. The integrated circuit includes, in its category, microprocessors, image processing circuits, digital signal processors (DSPs), microcontrollers, large scale integrated circuits (LSIs) including at least one of a microprocessor, an image processing circuit, a DSP, and a microcontroller, and programmable logic devices (PLDs) such as field programmable gate arrays (FPGAs) and complex PLDs (CPLDs). Further, the semiconductor display device includes, in its category, liquid crystal display devices, light-emitting devices in which a light-emitting element typified by an organic light-emitting element (an OLED) is provided in each pixel, electronic paper, digital micromirror devices (DMDs), plasma display panels (PDPs), and field emission displays (FEDs).

(Embodiment 1)

Figure 1:
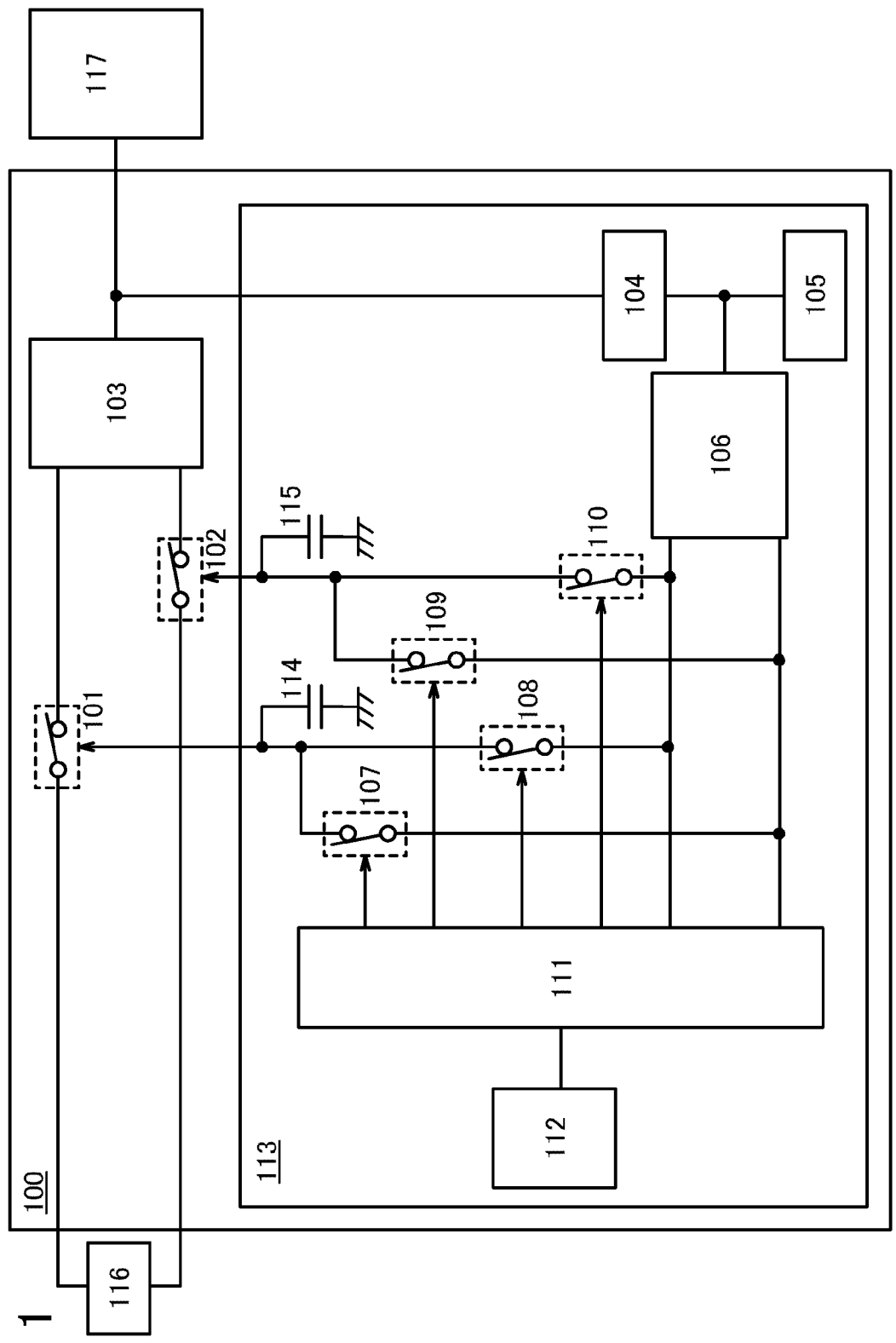
FIG. 1 illustrates a structure of a power supply circuit.

FIG. 1 illustrates a structure example of a power supply circuit 100 according to one embodiment of the present invention. The power supply circuit 100 in FIG. 1 includes a power switch 101, a power switch 102, a voltage regulator 103, and a control circuit 113.

Voltage is supplied from a power supply 116 to the power supply circuit 100. The power switches 101 and 102 each have a function of controlling input of the voltage to the voltage regulator 103. Specifically, the voltage corresponds to a difference between a first potential input from the power supply 116 to the voltage regulator 103 through the power switch 101 and a second potential input from the power supply 116 to the voltage regulator 103 through the power switch 102.

Note that in the case where the voltage output from the power supply 116 is AC voltage, as illustrated in FIG. 1, the power switch 101 controlling input of the first potential to the voltage regulator 103 and the power switch 102 controlling input of the second potential to the voltage regulator 103 are provided in the power supply circuit 100. In the case where the voltage output from the power supply 116 is DC voltage, as illustrated in FIG. 1, the power switch 101 controlling input of the first potential to the voltage regulator 103 and the power switch 102 controlling input of the second potential to the voltage regulator 103 may be provided in the power supply circuit 100; alternatively, the second potential may be a ground potential, the power switch 102 controlling input of the second potential to the voltage regulator 103 may be eliminated, and the power switch 101 controlling input of the first potential to the voltage regulator 103 may be provided in the power supply circuit 100.

In one embodiment of the present invention, a transistor having high withstand voltage is used as each of the power switches 101 and 102. Specifically, the transistor includes a wide-gap semiconductor whose bandgap is two or more times that of silicon in an active layer. For example, an oxide semiconductor, gallium nitride, or silicon carbide can be used as the wide-gap semiconductor.

Among the wide-gap semiconductors, gallium oxide, which is one of the oxide semiconductors, has a particularly higher bandgap than another wide-gap semiconductor. For example, β-gallium oxide that has the most stable structure has a bandgap of 4.8 to 4.9 eV, which is four or more times the silicon bandgap of approximately 1.1 eV. Further, the bandgap of β-gallium oxide is larger than each of the bandgap of silicon carbide, which is a wide-gap semiconductor (in the case of 4H-silicon carbide, a bandgap of 3.0 to 3.3 eV) and the bandgap of gallium nitride (3.4 eV). Thus, the dielectric breakdown electric field of gallium oxide is 20 or more times that of silicon and is 2 or more times each of those of silicon carbide and gallium nitride. A field-effect transistor including gallium oxide in an active layer has high withstand voltage.

Further, the field-effect transistor including gallium oxide in an active layer has lower resistance in an on state (on resistance) than a transistor including another wide-gap semiconductor. Accordingly, the use of gallium oxide in an active layer can reduce power loss due to the on resistance of the transistor.

In the case where silicon carbide, gallium nitride, or the like is used, it is difficult to form a field-effect transistor having high withstand voltage and low on resistance. Thus, for example, in the case where a switch having a withstand voltage of 4 kV or higher is formed using silicon carbide, a bipolar transistor is used. However, the bipolar transistor has a lower speed of switching an on state and an off state than the field-effect transistor; thus, the period of transition from an on state to an off state or the period of transition from an off state to an on state is long. Accordingly, it is difficult to reduce power loss due to the switching. However, in the case where gallium oxide is used, it is comparatively easy to form a field-effect transistor having high withstand voltage and low on resistance compared to the case where silicon carbide, gallium nitride, or the like is used. Accordingly, the use of a field-effect transistor including gallium oxide in an active layer as the power switch 101 or 102 can achieve high-speed switching of the power switch 101 or 102. Consequently, power loss due to the switching can be reduced.

The voltage regulator 103 has a function of regulating voltage input from the power supply 116 through the power switches 101 and 102. Specifically, voltage regulation in the voltage regulator 103 means any one or more of conversion of AC voltage into DC voltage, change of a voltage level, and smoothing of a voltage level.

Specifically, in the case where AC voltage is converted into DC voltage in the voltage regulator 103, a rectifier circuit may be provided in the voltage regulator 103. In the case where the voltage level is changed in the voltage regulator 103, a step-up converter or a step-down converter may be provided in the voltage regulator 103. In the case where the voltage level is smoothed in the voltage regulator 103, a smoothing circuit may be provided in the voltage regulator 103.

For example, in the case where the power supply 116 is a commercial power supply, the voltage regulator 103 converts AC voltage into DC voltage by the rectifier circuit, smoothes the level of the DC voltage by the smoothing circuit, and steps the level of the smoothed DC voltage down to a level needed in a load 117 or an electric storage device 104 by the step-down converter.

Voltage regulated in the voltage regulator 103 is applied to the load 117 and the control circuit 113.

Note that the voltage regulator 103 may have a function of isolating the power supply 116 from the load 117 in addition to the function of voltage regulation. For example, by using a transformer or a photocoupler, the voltage regulator 103 can have the function of isolating the power supply 116 from the load 117.

In the power supply circuit 100 in FIG. 1, the control circuit 113 includes the electric storage device 104, an auxiliary power supply 105, a voltage generation circuit 106, switches 107 to 110, a level shifter 111, an input device 112, and capacitors 114 and 115.

The electric storage device 104 has a function of temporarily storing power supplied from the voltage regulator 103. Specifically, the electric storage device 104 includes an electric storage portion such as a capacitor or a secondary battery that can store power with the use of voltage applied from the voltage regulator 103. In one embodiment of the present invention, since the control circuit 113 includes the electric storage device 104, even when supply of voltage from the voltage regulator 103 to the control circuit 113 is stopped, the control circuit 113 can be operated using power stored in the electric storage device 104.

As the secondary battery, for example, a lead-acid battery, a nickel-cadmium battery, a nickel-hydride battery, a lithium-ion battery, or the like can be used. Further, the capacitor can be, for example, an electric double layer capacitor, or a hybrid capacitor in which one of a pair of electrodes has an electric double layer structure and the other of the pair of electrodes utilizes oxidation-reduction reaction. The hybrid capacitor, for example, includes a lithium ion capacitor in which a positive electrode has an electric double layer structure and a negative electrode has a lithium ion secondary battery structure.

The electric storage device 104 may include a charge control circuit for preventing overcharge or overdischarge of the electric storage portion, in addition to the electric storage portion.

The auxiliary power supply 105 has a function of compensating power needed for the control circuit 113 to operate when the amount of power that can be output from the electric storage device 104 is insufficient. A primary battery or the like can be used as the auxiliary power supply 105.

The voltage generation circuit 106 has a function of generating voltage for controlling switching of the power switches 101 and 102 with the use of voltage output from the electric storage device 104 or the auxiliary power supply 105. Specifically, the voltage generation circuit 106 has a function of generating voltage for turning on the power switches 101 and 102 and a function of generating voltage for turning off the power switches 101 and 102.

The input device 112 has a function of giving an instruction to control the operating states of the power switches 101 and 102 to the level shifter 111. Note that the operating states of the power switches 101 and 102 are determined by switching of the switches 107 to 110.

Specifically, the input device 112 includes an input portion that converts an instruction to control the operating states of the power switches 101 and 102 given from the outside into an electric signal, and a signal processor that decodes the instruction included in the electric signal and generates a signal for controlling the switching of the switches 107 to 110 in accordance with the instruction. For example, as the input portion, in addition to a keyboard, a mouse, or a touch panel, it is possible to use a reception circuit capable of receiving signals wirelessly using light such as infrared light, an electric wave, or the like.

The level shifter 111 has a function of generating signals for controlling the switching of the switches 107 to 110 by regulating the voltage of a signal from the input device 112 with the use of the voltage generated in the voltage generation circuit 106. Specifically, the level shifter 111 generates a signal for turning on or off both the switches 107 and 109 and a signal for turning on or off both the switches 108 and 110 by regulating the voltage of a signal from the input device 112 with the use of voltage for turning on the power switches 101 and 102 and voltage for turning off the power switches 101 and 102 which are generated in the voltage generation circuit 106.

The switching of the switches 107 to 110 is performed in response to signals generated in the level shifter 111. Specifically, when the switches 108 and 110 are on, the voltage for turning on the power switches 101 and 102 that is generated in the voltage generation circuit 106 is applied to the power switches 101 and 102. When the switches 108 and 110 are off, the voltage for turning on the power switches 101 and 102 is continuously applied to the power switches 101 and 102. Further, when the switches 107 and 109 are on, the voltage for turning off the power switches 101 and 102 that is generated in the voltage generation circuit 106 is applied to the power switches 101 and 102. When the switches 107 and 109 are off, the voltage for turning off the power switches 101 and 102 is continuously applied to the power switches 101 and 102.

In one embodiment of the present invention, a transistor with extremely low off-state current is used as each of the switches 107 to 110 so that the voltage is continuously applied to the power switches 101 and 102. With this structure, even when generation of the voltage for determining the operating states of the power switches 101 and 102 in the voltage generation circuit 106 is stopped, the operating states of the power switches 101 and 102 can be kept. Thus, the power consumption of the voltage generation circuit 106 is reduced, so that the power consumption of the power supply circuit 100 can be reduced.

Since the transistor including a wide-gap semiconductor whose bandgap is two or more times that of silicon in an active layer has extremely low off-state current, the transistor is preferably used as each of the switches 107 to 110. For example, an oxide semiconductor, gallium nitride, or silicon carbide can be used as the wide-gap semiconductor.

Note that a highly-purified oxide semiconductor (a purified oxide semiconductor) obtained by reduction of impurities such as moisture or hydrogen that serve as electron donors (donors) and reduction of oxygen vacancies is an intrinsic (i-type) semiconductor or a substantially intrinsic semiconductor. Thus, with the use of an oxide semiconductor film that is highly purified by a sufficient decrease in concentration of impurities such as moisture or hydrogen and reduction of oxygen vacancies, the off-state current of the transistor can be decreased. Consequently, the use of a transistor including a highly-purified oxide semiconductor film as each of the switches 107 to 110 reduces the power consumption of the voltage generation circuit 106, so that the effect of reducing the power consumption of the power supply circuit 100 can be increased.

Specifically, various experiments can prove low off-state current of a transistor including a highly-purified oxide semiconductor in a channel formation region. For example, even when an element has a channel width of $1 \times 10^6$ μm and a channel length of 10 μm, off-state current can be lower than or equal to the measurement limit of a semiconductor parameter analyzer, that is, lower than or equal to $1 \times 10^{-13}$ A, at a voltage (drain voltage) between a source electrode and a drain electrode of 1 to 10 V. In that case, it can be seen that off-state current standardized on the channel width of the transistor is lower than or equal to 100 zA/μm. In addition, a capacitor and a transistor are connected to each other and off-state current is measured using a circuit in which electrical charge flowing to or from the capacitor is controlled by the transistor. In the measurement, a highly-purified oxide semiconductor film is used for a channel formation region of the transistor, and the off-state current of the transistor is measured from a change in the amount of electrical charge of the capacitor per unit hour. As a result, it can be seen that, in the case where the voltage between the source electrode and the drain electrode of the transistor is 3 V, a lower off-state current of several tens of yoctoamperes per micrometer (yA/μm) is obtained. Accordingly, the transistor including the highly-purified oxide semiconductor film for a channel formation region has much lower off-state current than a crystalline silicon transistor.

Among the oxide semiconductors, unlike silicon carbide or gallium nitride, an In—Ga—Zn-based oxide, an In—Sn—Zn-based oxide, or the like has an advantage of high mass productivity because a transistor with favorable electrical characteristics can be formed by sputtering or a wet process. Further, unlike silicon carbide or gallium nitride, the oxide semiconductor (the In—Ga—Zn-based oxide) can be deposited even at room temperature; thus, a transistor with favorable electrical characteristics can be formed over a glass substrate or an integrated circuit using silicon. Furthermore, a larger substrate can be used.

The capacitor 114 has a function of holding voltage applied to the power switch 101 when the switches 107 and 108 are off. The capacitor 115 has a function of holding voltage applied to the power switch 102 when the switches 109 and 110 are off.

Note that in the case where gate capacitance formed between a gate electrode and a semiconductor film of the transistor used as the power switch 101 or parasitic capacitance added to the gate electrode is high enough to hold applied voltage and the leakage current of the transistor is sufficiently low, the power supply circuit 100 according to one embodiment of the present invention does not necessarily include the capacitor 114. Similarly, in the case where gate capacitance of the transistor used as the power switch 102 or parasitic capacitance added to a gate electrode of the transistor is high enough to hold applied voltage and the leakage current of the transistor is sufficiently low, the power supply circuit 100 according to one embodiment of the present invention does not necessarily include the capacitor 115.

Note that in this specification, leakage current means current flowing between a gate electrode and a source or drain terminal of a transistor. A source terminal of a transistor means a source region that is part of a semiconductor film functioning as an active layer or a source electrode that is connected to the semiconductor film functioning as an active layer. Similarly, a drain terminal of a transistor means a drain region that is part of a semiconductor film functioning as an active layer or a drain electrode that is connected to the semiconductor film functioning as an active layer.

The terms "source terminal" and "drain terminal" of a transistor interchange with each other depending on the type of the channel of the transistor or levels of potentials applied to the source terminal and the drain terminal. In general, in an n-channel transistor, a terminal to which a low potential is applied is called a source terminal, and a terminal to which a high potential is applied is called a drain terminal. Further, in a p-channel transistor, a terminal to which a low potential is applied is called a drain terminal, and a terminal to which a high potential is applied is called a source terminal. In this specification, although the connection relation of the transistor is described assuming that the source terminal and the drain terminal are fixed in some cases for convenience, actually, the names of the source terminal and the drain terminal interchange with each other depending on the relation of the potentials.

When the power switches 101 and 102 are on, voltage is supplied from the power supply 116 to the voltage regulator 103. In addition, with the voltage, power is stored in the electric storage device 104.

When the power switches 101 and 102 are off, supply of voltage from the power supply 116 to the voltage regulator 103 is stopped. Thus, although power is not supplied to the electric storage device 104, the control circuit 113 can be operated using power stored in the electric storage device 104 or the auxiliary power supply 105 in one embodiment of the present invention, as described above. In other words, in the power supply circuit 100 according to one embodiment of the present invention, supply of voltage to the voltage regulator 103 can be stopped while the operating states of the power switches 101 and 102 are controlled by the control circuit 113. By stopping the supply of voltage to the voltage regulator 103, it is possible to prevent power consumption due to charging and discharging of the capacitance of the voltage regulator 103 when voltage is not supplied to the load 117. Consequently, the power consumption of the power supply circuit 100 can be reduced.

In particular, in the case where the power consumption of the load 117 is high, in order to improve the current capability or withstand voltage of a semiconductor element in the voltage regulator 103, the size of the semiconductor element tends to be increased. Thus, the capacitance of the semiconductor element, a wiring, or the like in the voltage regulator 103 is inevitably increased, so that power consumed by charging and discharging of the capacitance is also increased. In one embodiment of the present invention, the power consumed in the voltage regulator 103 can be reduced. Accordingly, in the case where the power consumption of the load 117 is high, the effect of reducing the power consumption of the power supply circuit 100 is particularly significant.

Next, operation examples of the power supply circuit 100 in FIG. 1 are described with reference to FIG. 2, FIG. 3, FIG. 4, and FIG. 5.

Figure 2:
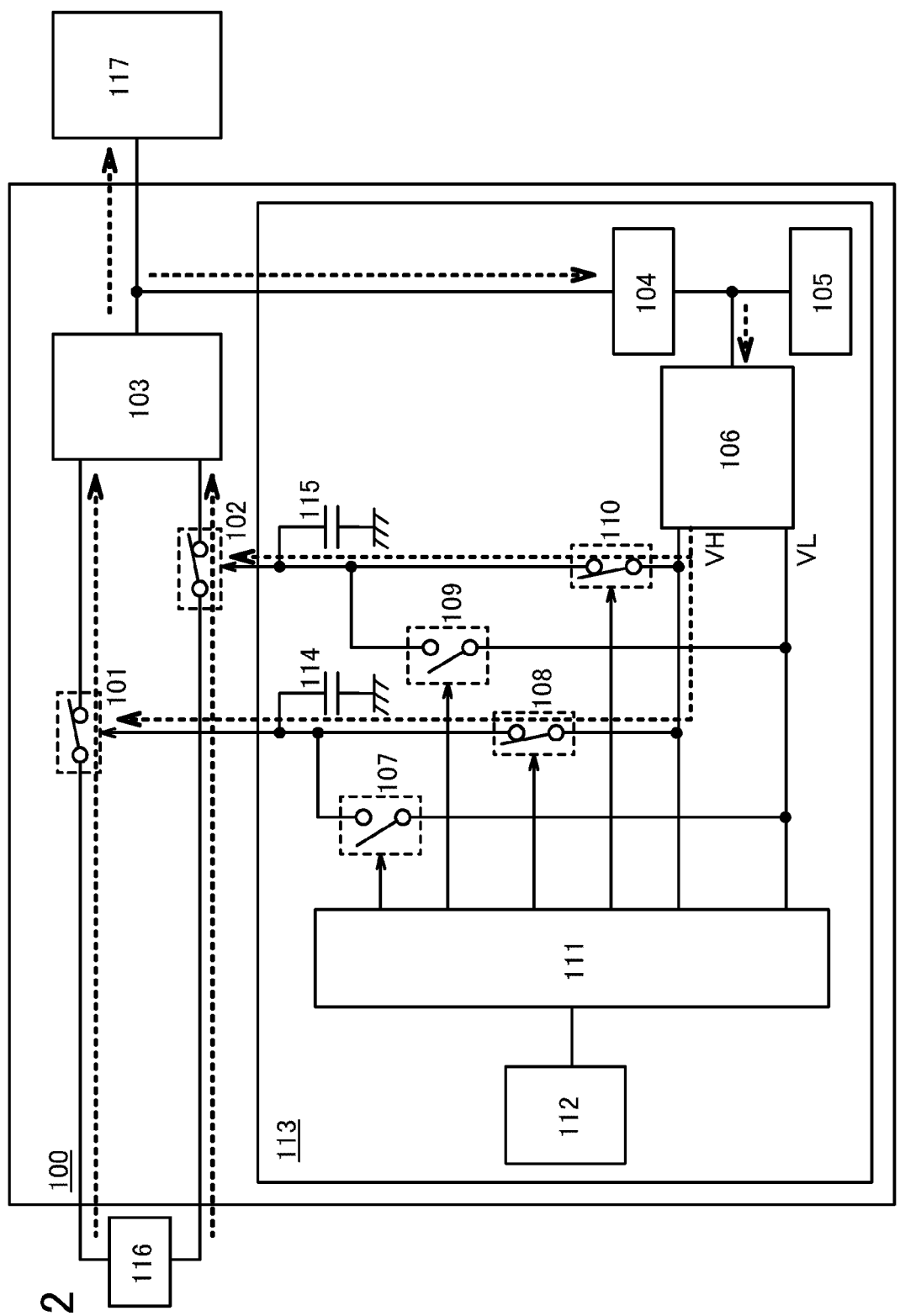
FIG. 2 illustrates operation of the power supply circuit.

First, operation from an initial state to a state where power is supplied to the load 117 is described with reference to FIG. 2. In the initial state, power is not stored in the electric storage device 104, so that voltage is applied from the auxiliary power supply 105 to the voltage generation circuit 106. The voltage generation circuit 106 generates voltage for turning on the power switches 101 and 102 (in FIG. 2, high-level voltage VH) and voltage for turning off the power switches 101 and 102 (in FIG. 2, low-level voltage VL) with the use of the applied voltage.

An instruction to control the operating states of the power switches 101 and 102 is given from the outside to the input device 112. In FIG. 2, specifically, an instruction to turn on the power switches 101 and 102 is given. The input device 112 generates signals for controlling the switching of the switches 107 to 110 to control the operating states of the power switches 101 and 102 in accordance with the instruction.

The level shifter 111 generates signals for controlling the switching of the switches 107 to 110 by regulating the voltage of a signal from the input device 112 with the use of the voltage VH and the voltage VL generated in the voltage generation circuit 106.

The switching of the switches 107 to 110 is performed in response to signals generated in the level shifter 111. Specifically, the switches 107 and 109 are turned off and the switches 108 and 110 are turned on. Further, the voltage VH generated in the voltage generation circuit 106 is applied to the power switches 101 and 102 and the capacitors 114 and 115 through the switches 108 and 110 that are on.

The power switches 101 and 102 are turned on when the voltage VH is applied. Through the power switches 101 and 102 that are on, voltage output from the power supply 116 is applied to the voltage regulator 103.

The voltage regulator 103 regulates applied voltage. Specifically, in the case where applied voltage is AC voltage, the voltage regulator 103 performs regulation such as conversion of AC voltage into DC voltage, change of a voltage level, or smoothing of a voltage level.

Voltage regulated in the voltage regulator 103 is applied to the load 117 and the electric storage device 104 in the control circuit 113. The electric storage device 104 stores power with the use of applied voltage. When power is stored in the electric storage device 104, supply of voltage from the auxiliary power supply 105 to the voltage generation circuit 106 is stopped, and supply of voltage from the electric storage device 104 to the voltage generation circuit 106 is started. Thus, in one embodiment of the present invention, voltage is supplied from the auxiliary power supply 105 to the voltage generation circuit 106 only until power is stored in the electric storage device 104. Accordingly, compared to the case where voltage is continuously supplied from the auxiliary power supply 105 to the voltage generation circuit 106, the power consumption of the auxiliary power supply 105 can be reduced.

The voltage generation circuit 106 performs the above operation, specifically, generation of the voltage VH and the voltage VL with the use of the voltage applied from the electric storage device 104. The operating states of the level shifter 111, the switches 107 to 110, and the power switches 101 and 102 are kept with the use of the voltage VH and the voltage VL.

Figure 3:
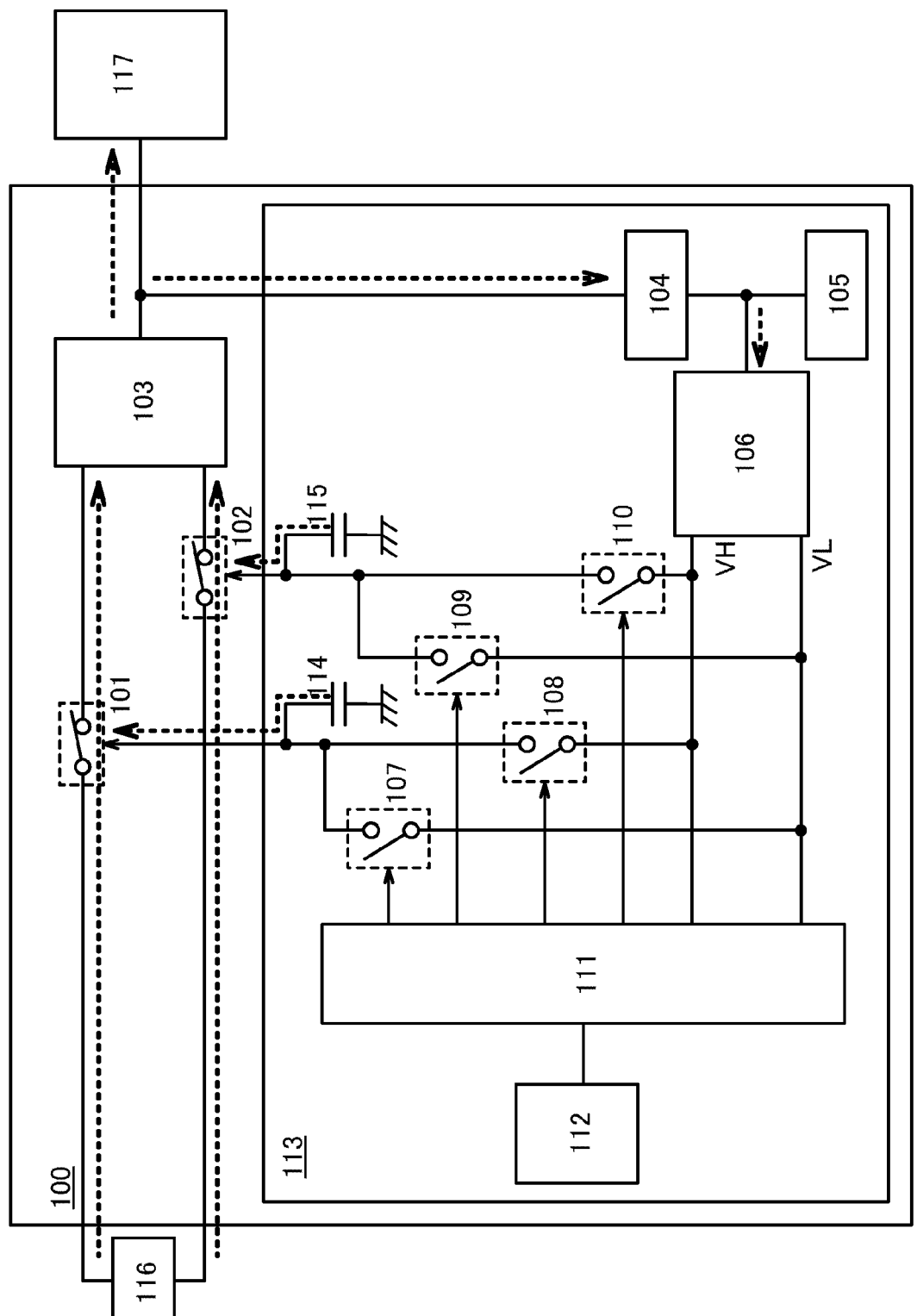
FIG. 3 illustrates operation of the power supply circuit.

Next, operation of turning off the switches 107 to 110 while power is continuously supplied to the load 117 is described with reference to FIG. 3. As illustrated in FIG. 3, when the switches 107 and 109 are kept off and the switches 108 and 110 are turned off, the capacitors 114 and 115 hold the voltage VH. Thus, with the capacitor 114, the voltage VH is continuously supplied to the power switch 101. Further, with the capacitor 115, the voltage VH is continuously supplied to the power switch 102. Consequently, even when the switches 107 to 110 are off, the power switches 101 and 102 are kept on.

Figure 4:
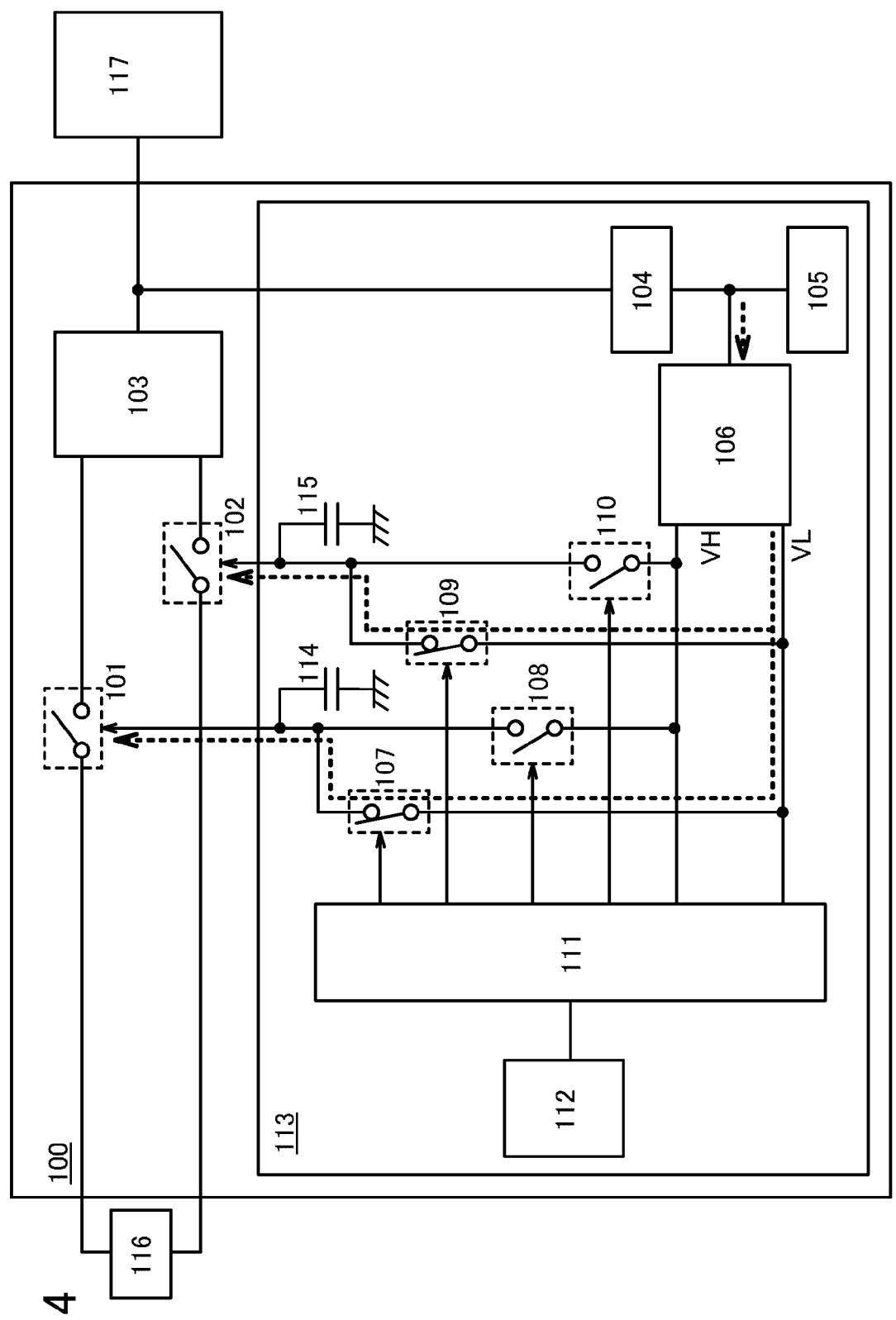
FIG. 4 illustrates operation of the power supply circuit.

Next, operation of stopping supply of power to the load 117 is described with reference to FIG. 4. Also in FIG. 4, the voltage generation circuit 106 generates the voltage VH for turning on the power switches 101 and 102 and the voltage VL for turning off the power switches 101 and 102 with the use of the voltage applied from the electric storage device 104.

An instruction to control the operating states of the power switches 101 and 102 is given from the outside to the input device 112. In FIG. 4, specifically, an instruction to turn off the power switches 101 and 102 is given. The input device 112 generates signals for controlling the switching of the switches 107 to 110 to control the operating states of the power switches 101 and 102 in accordance with the instruction.

The level shifter 111 generates signals for controlling the switching of the switches 107 to 110 by regulating the voltage of a signal from the input device 112 with the use of the voltage VH and the voltage VL generated in the voltage generation circuit 106.

The switching of the switches 107 to 110 is performed in response to signals generated in the level shifter 111. Specifically, the switches 107 and 109 are turned on and the switches 108 and 110 are turned off. The voltage VL generated in the voltage generation circuit 106 is applied to the power switches 101 and 102 and the capacitors 114 and 115 through the switches 107 and 109 that are on.

The power switches 101 and 102 are turned off when the voltage VL is applied. Thus, supply of voltage from the power supply 116 to the voltage regulator 103 and supply of power to the load 117 are stopped.

Figure 5:
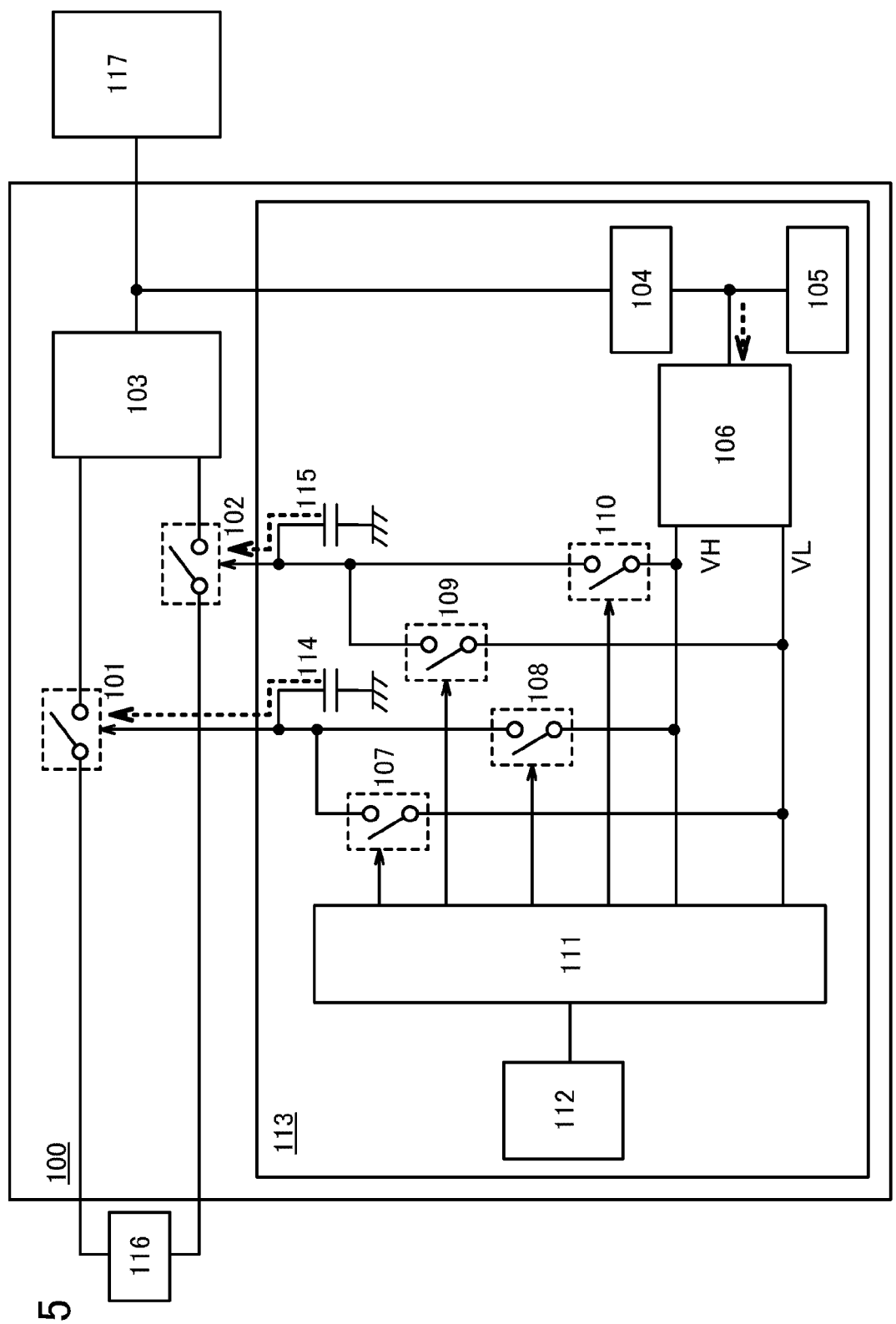
FIG. 5 illustrates operation of the power supply circuit.

Next, operation of turning off the switches 107 to 110 while continuously stopping supply of power to the load 117 is described with reference to FIG. 5. As illustrated in FIG. 5, when the switches 108 and 110 are kept off and the switches 107 and 109 are turned off, the capacitors 114 and 115 hold the voltage VL. Thus, with the capacitor 114, the voltage VL is continuously supplied to the power switch 101. Further, with the capacitor 115, the voltage VL is continuously supplied to the power switch 102. Consequently, even when the switches 107 to 110 are off, the power switches 101 and 102 are kept off.

(Embodiment 2)

In this embodiment, a more specific structure example of the power supply circuit 100 in FIG. 1 is described.

Figure 6:
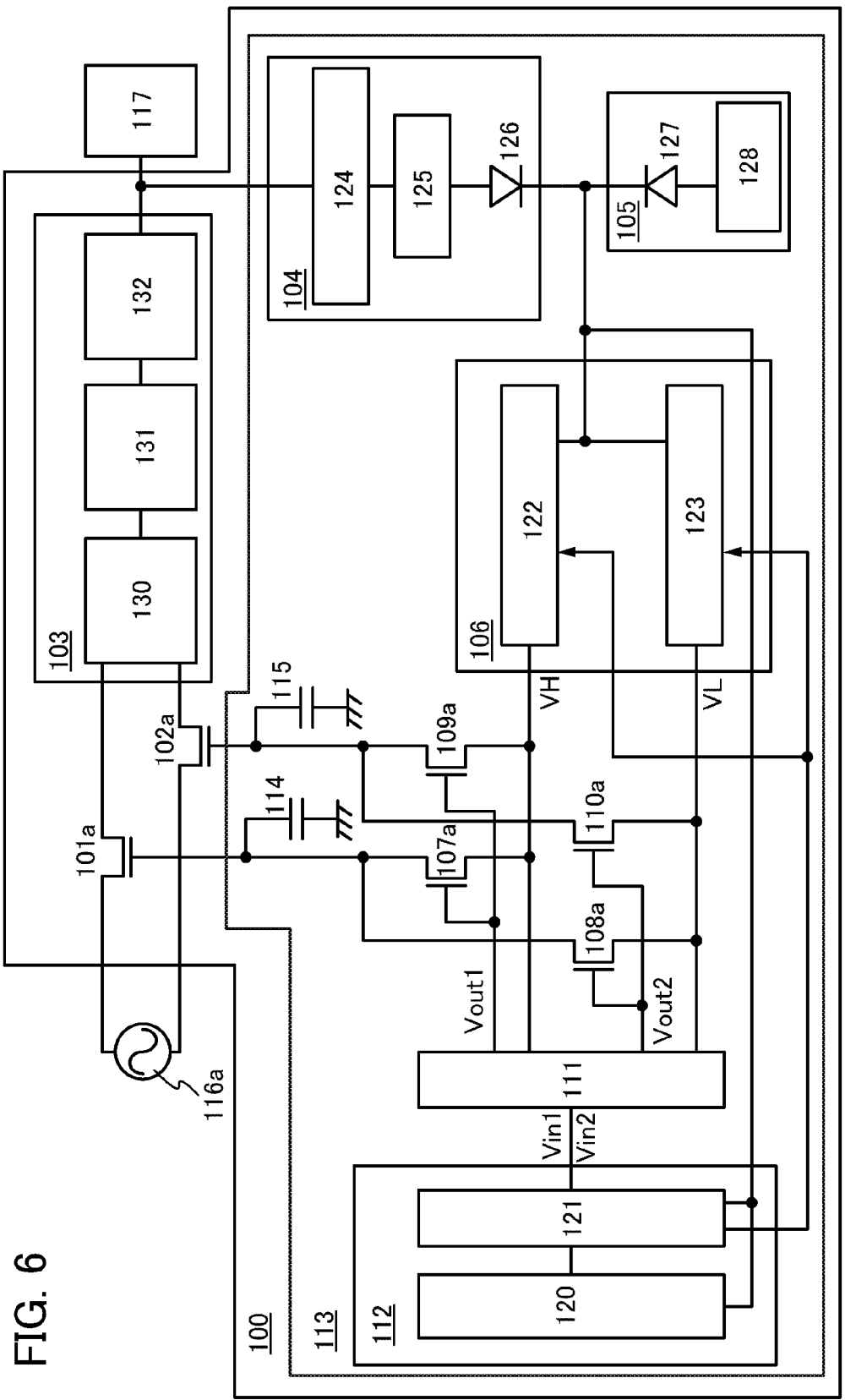
FIG. 6 illustrates a structure of the power supply circuit.

FIG. 6 illustrates a structure example of the power supply circuit 100 according to one embodiment of the present invention. The power supply circuit 100 in FIG. 6 includes a transistor 101a functioning as the power switch 101, a transistor 102a functioning as the power switch 102, the voltage regulator 103, and the control circuit 113.

Note that in FIG. 6, one transistor 101a and one transistor 102a are used as the power switch 101 and the power switch 102, respectively; however, in the power supply circuit 100 according to one embodiment of the present invention, a plurality of transistors may be used as the power switch. For example, the use of a plurality of transistors connected in parallel can achieve a power switch capable of controlling higher power.

In this specification, a state where transistors are connected to each other in parallel means a state where one of a source terminal and a drain terminal of a first transistor is connected to one of a source terminal and a drain terminal of a second transistor and the other of the source terminal and the drain terminal of the first transistor is connected to the other of the source terminal and the drain terminal of the second transistor. In addition, a state where transistors are connected to each other in series means a state where only one of a source terminal and a drain terminal of a first transistor is connected to only one of a source terminal and a drain terminal of a second transistor.

In FIG. 6, the transistors 101a and 102a each have a single-gate structure where one channel formation region corresponding to one gate electrode is provided. However, the transistors 101a and 102a may each have a multi-gate structure where a plurality of channel formation regions are formed by provision of a plurality of gate electrodes electrically connected to each other.

The transistors 101a and 102a each include a gate electrode at least on one side of an active layer. Alternatively, the transistors 101a and 102a may each include a pair of gate electrodes with the active layer positioned therebetween. When the transistor includes a pair of gate electrodes with the active layer positioned therebetween, a signal for controlling switching may be supplied to one of the gate electrodes, and the other of the gate electrodes may be electrically isolated (floating) or may be supplied with a potential from another element. In the latter case, potentials at the same level may be supplied to the pair of electrodes, or a fixed potential such as a ground potential may be supplied only to the other of the gate electrodes. By controlling the level of a potential applied to the other of the gate electrodes, the threshold voltage of the transistor can be controlled.

In this specification, the term "connection" means electrical connection and corresponds to a state where current, voltage, or a potential can be supplied or transmitted. Accordingly, a connection state does not always mean a direct connection state but includes an indirect connection state through a circuit element such as a resistor, a diode, a transistor, or a capacitor so that current, voltage, or a potential can be supplied or transmitted.

AC voltage is supplied to the power supply circuit 100 from an AC power supply 116a that is an example of the power supply 116 in FIG. 1. The transistors 101a and 102a have a function of controlling input of the AC voltage to the voltage regulator 103.

In one embodiment of the present invention, as described in Embodiment 1, a transistor having high withstand voltage is used as each of the transistors 101a and 102a. Specifically, the transistor includes a wide-gap semiconductor whose bandgap is two or more times that of silicon in an active layer. For example, an oxide semiconductor, gallium nitride, or silicon carbide can be used as the wide-gap semiconductor.

Note that in FIG. 6, the transistors 101a and 102a are each a MOSFET. However, the transistors 101a and 102a can each be an insulated gate bipolar transistor (IGBT), a metal semiconductor field effect transistor (MESFET), or the like. Note that power loss due to switching can be reduced using a unipolar transistor such as a MOSFET or a MESFET compared to the case of using a bipolar transistor such as an IGBT.

In FIG. 6, the voltage regulator 103 includes a rectifier circuit 130, a smoothing circuit 131, and a step-down converter 132. The voltage regulator 103 regulates AC voltage when the AC voltage is input from the AC power supply 116a through the transistors 101a and 102a. Specifically, in FIG. 6, the rectifier circuit 130 converts the AC voltage from the AC power supply 116a into DC voltage. The smoothing circuit 131 smoothes a ripple of the DC voltage output from the rectifier circuit 130. The level of the DC voltage output from the smoothing circuit 131 is stepped down to a level needed for the load 117 or the electric storage device 104 by the step-down converter 132, and the DC voltage is output from the voltage regulator 103.

DC voltage (hereinafter simply referred to as voltage) regulated in the voltage regulator 103 is applied to the load 117 and the control circuit 113.

In the power supply circuit 100 in FIG. 6, the control circuit 113 includes the electric storage device 104, the auxiliary power supply 105, the voltage generation circuit 106, transistors 107a to 110a functioning as the switches 107 to 110, the level shifter 111, the input device 112, and the capacitors 114 and 115.

The electric storage device 104 includes an electric storage portion 125 such as a capacitor or a secondary battery that can store power with the use of voltage applied from the voltage regulator 103, a charge control circuit 124, and a diode 126.

The charge control circuit 124 has a function of preventing the secondary battery or the capacitor used as the electric storage portion 125 from decreasing or eliminating its function as a secondary battery or a capacitor by a decrease in lifetime, ignition due to internal short-circuit by overcharge or overdischarge, for example. Note that a nickel-cadmium battery that is one of secondary batteries does not easily cause a decrease or elimination of its function as a secondary battery by overcharge or overdischarge. Thus, in the case where a nickel-cadmium battery is used as the electric storage portion 125, it is not always necessary to provide the charge control circuit 124 in the electric storage device 104.

Specifically, the charge control circuit 124 checks the charging condition of the electric storage portion 125 by monitoring voltage (terminal voltage) between terminals of the secondary battery or the capacitor. When the terminal voltage is over the upper limit, the charge control circuit 124 determines that the electric storage portion 125 is further charged from a full charge state, blocks the path of current supplied to the electric storage portion 125, and prevents the electric storage portion 125 from being overcharged. When the terminal voltage is below the lower limit, the charge control circuit 124 determines that the electric storage portion 125 discharges current whose amount exceeds capacitance that should be left in the electric storage portion 125, blocks the path of current discharged from the electric storage portion 125, and prevents the electric storage portion 125 from over discharging.

The diode 126 has a function of stopping output of voltage from the electric storage device 104 when the amount of power that can be output from the electric storage portion 125 is insufficient and the level of voltage output from the electric storage portion 125 is lower than a level needed for the voltage generation circuit 106. When the level of the voltage output from the electric storage portion 125 is higher than or equal to the level needed for the voltage generation circuit 106, voltage is supplied from the electric storage portion 125 to the voltage generation circuit 106 through the diode 126.

The auxiliary power supply 105 includes a primary battery 128 and a diode 127. Power is stored in the primary battery 128 so that voltage at the level needed for the voltage generation circuit 106 can be output. The diode 127 has a function of stopping output of voltage from the auxiliary power supply 105 when the level of voltage output from the electric storage portion 125 is higher than or equal to the level needed for the voltage generation circuit 106. When the level of the voltage output from the electric storage portion 125 is lower than the level needed for the voltage generation circuit 106, voltage is supplied from the primary battery 128 to the voltage generation circuit 106 through the diode 127.

The voltage generation circuit 106 includes a positive voltage generation circuit 122 and a negative voltage generation circuit 123. The positive voltage generation circuit 122 has a function of generating voltage for turning on the transistors 101a and 102a (in FIG. 6, high-level voltage VH) from applied voltage. The negative voltage generation circuit 123 has a function of generating voltage for turning off the transistors 101a and 102a (in FIG. 6, low-level voltage VL) from applied voltage.

Specifically, each of the positive voltage generation circuit 122 and the negative voltage generation circuit 123 can be a step-up DCDC converter that is one of converters, or the like.

The input device 112 includes an input portion 120 and a signal processor 121. When an instruction to control the operating states of the transistors 101a and 102a is input from the outside to the input device 112, the input portion 120 converts the instruction into an electric signal. For example, in the case where the input portion 120 is a reception circuit that can receive signals wirelessly using an electric wave, an infrared ray, or the like, the input portion 120 includes an antenna receiving an electric wave, a demodulation circuit demodulating an electric signal from the antenna, and the like.

The signal processor 121 decodes an instruction included in an electric signal output from the input portion 120, and generates signals for controlling switching of the transistors 107a to 110a in accordance with the instruction. The signals are supplied to the level shifter 111. In FIG. 6, a signal having voltage Vin1 and a signal having voltage Vin2 are supplied to the level shifter 111.

Note that in FIG. 6, the input device 112 is operated by application of voltage from the electric storage device 104 or the auxiliary power supply 105.

Further, in FIG. 6, the signal processor 121 has a function of generating signals for controlling the operation of the voltage generation circuit 106. Specifically, the positive voltage generation circuit 122 generates the voltage VH and stops generation of the voltage VH in response to the signal from the signal processor 121. In addition, the negative voltage generation circuit 123 generates the voltage VL and stops generation of the voltage VL in response to the signal from the signal processor 121.

The level shifter 111 generates signals for controlling the switching of the transistors 107a to 110a by regulating the voltage Vin1 and the voltage Vin2 of signals from the input device 112 with the use of the voltage VH and the voltage VL generated in the voltage generation circuit 106.

In FIG. 6, a signal having voltage Vout1 for controlling the switching of the transistors 107a and 109a and a signal having voltage Vout2 for controlling the switching of the transistors 108a and 110a are generated in the level shifter 111 by regulating the signals from the input device 112.

The switching of the transistors 107a to 110a is performed in response to the voltage Vout1 or the voltage Vout2 of the signal generated in the level shifter 111. In FIG. 6, the voltage Vout1 is supplied to gate electrodes of the transistors 107a and 109a, and the voltage Vout2 is supplied to gate electrodes of the transistors 108a and 110a.

When the transistors 107a and 109a are on, the voltage VH is applied to the gate electrodes of the transistors 101a and 102a and the capacitors 114 and 115. When the transistors 108a and 110a are on, the voltage VL is applied to the gate electrodes of the transistors 101a and 102a and the capacitors 114 and 115.

When the transistors 107a and 109a are off, the voltage VH is held in the capacitors 114 and 115; thus, the voltage VH is continuously applied to the gate electrodes of the transistors 107a and 109a. When the transistors 108a and 110a are off, the voltage VL is held in the capacitors 114 and 115; thus, the voltage VL is continuously applied to the gate electrodes of the transistors 108a and 110a.

In one embodiment of the present invention, as described in Embodiment 1, a transistor with extremely low off-state current is used as each of the transistors 107a to 110a. Specifically, the transistor includes a wide-gap semiconductor whose bandgap is two or more times that of silicon in an active layer. For example, an oxide semiconductor, gallium nitride, or silicon carbide can be used as the wide-gap semiconductor.

Note that in FIG. 6, the transistors 107a to 110a are used as the switches 107 to 110, respectively; however, in the power supply circuit 100 according to one embodiment of the present invention, a plurality of transistors may be used as the switch. For example, the use of a plurality of transistors connected in series can further reduce off-state leakage current of the switch.

In FIG. 6, the transistors 107a to 110a each have a single-gate structure where one channel formation region corresponding to one gate electrode is provided. However, the transistors 107a to 110a may each have a multi-gate structure where a plurality of channel formation regions are formed by provision of a plurality of gate electrodes electrically connected to each other.

The transistors 107a to 110a each include a gate electrode at least on one side of an active layer. Alternatively, the transistors 107a to 110a may each include a pair of gate electrodes with the active layer positioned therebetween.

Note that in FIG. 6, each of the transistors 107a to 110a is a MOSFET. However, each of the transistors 107a to 110a can be a MESFET or the like.

When the transistors 101a and 102a are on by application of the voltage VH to the gate electrodes of the transistors 101a and 102a, AC voltage is supplied from the AC power supply 116a to the voltage regulator 103. In addition, with the voltage, power is stored in the electric storage device 104.

When the transistors 101a and 102a are off by application of the voltage VL to the gate electrodes of the transistors 101a and 102a, supply of AC voltage from the AC power supply 116a to the voltage regulator 103 is stopped. Thus, although power is not supplied to the electric storage device 104, the control circuit 113 can be operated using power stored in the electric storage device 104 or the auxiliary power supply 105 in one embodiment of the present invention, as described above. In other words, in the power supply circuit 100 according to one embodiment of the present invention, supply of voltage to the voltage regulator 103 can be stopped while the operating states of the transistors 101a and 102a are controlled by the control circuit 113. By stopping the supply of voltage to the voltage regulator 103, it is possible to prevent power consumption due to charging and discharging of the capacitance of the voltage regulator 103 when voltage is not supplied to the load 117. Consequently, the power consumption of the power supply circuit 100 can be reduced.

In particular, in the case where the power consumption of the load 117 is high, in order to improve the current capability or withstand voltage of the semiconductor element in the voltage regulator 103, the size of the semiconductor element tends to be increased. Thus, the capacitance of the semiconductor element, the wiring, or the like in the voltage regulator 103 is inevitably increased, so that power consumed by charging and discharging of the capacitance is also increased. In one embodiment of the present invention, the power consumed in the voltage regulator 103 can be reduced. Accordingly, in the case where the power consumption of the load 117 is high, the effect of reducing the power consumption of the power supply circuit 100 is particularly significant.

Figure 7:
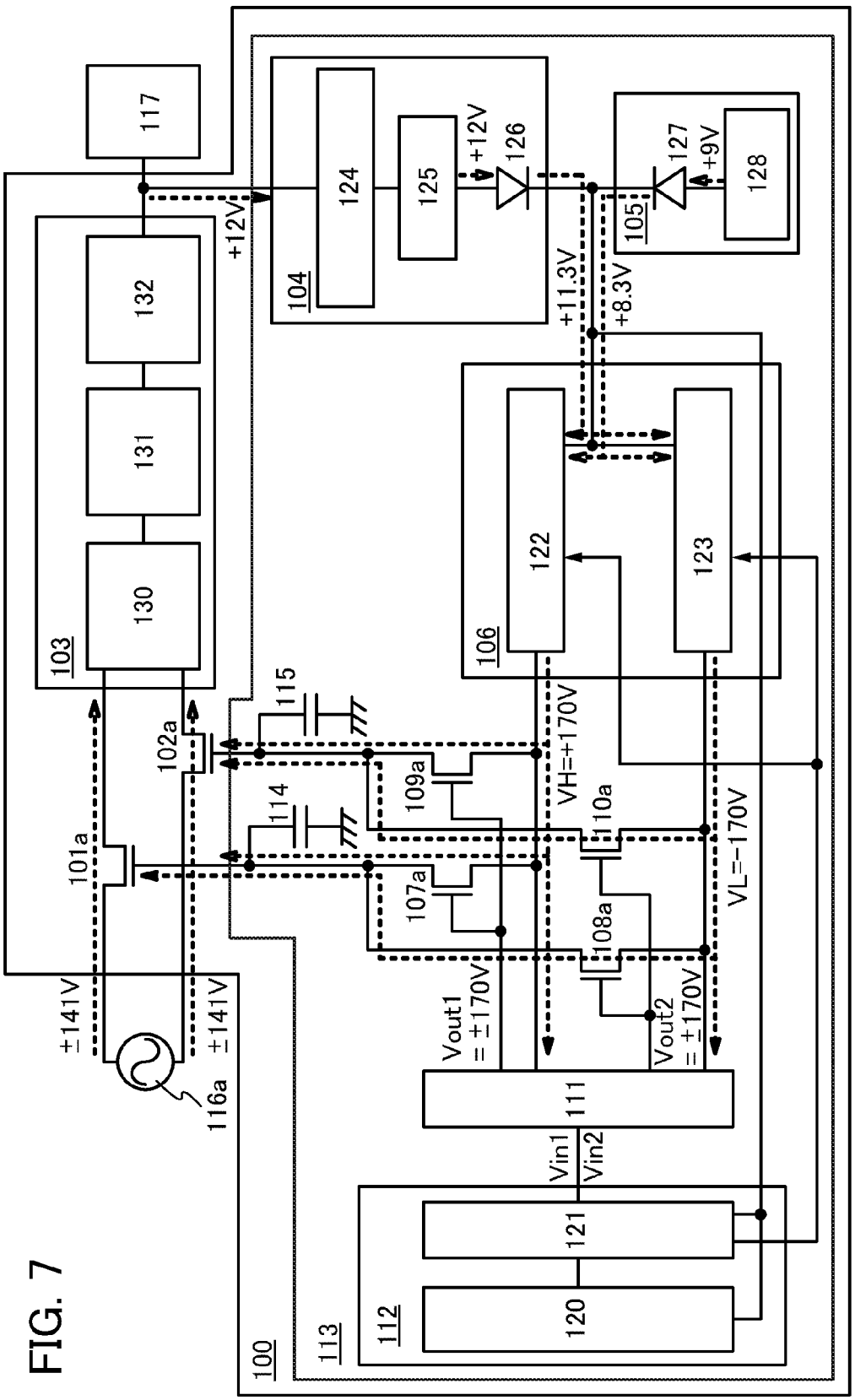
FIG. 7 illustrates operation of the power supply circuit.

Next, an operation example of the power supply circuit 100 in FIG. 6 is described with reference to FIG. 7.

First, in an initial state, power is not stored in the electric storage device 104; thus, voltage output from the primary battery 128 is applied to the positive voltage generation circuit 122 and the negative voltage generation circuit 123 through the diode 127. The voltage applied from the primary battery 128 is stepped down by the diode 127. Accordingly, in FIG. 7, a voltage of +9 V is output from the primary battery 128, a voltage of +8.3 V is output from a cathode of the diode 127, and the voltage of +8.3 V is applied to the positive voltage generation circuit 122 and the negative voltage generation circuit 123.

With the use of the applied voltage, the positive voltage generation circuit 122 generates the voltage VH, and the negative voltage generation circuit 123 generates the voltage VL. In FIG. 7, the positive voltage generation circuit 122 generates a voltage VH of +170 V, and the negative voltage generation circuit 123 generates a voltage VL of −170 V.

The input device 112 generates signals for controlling the switching of the transistors 107a to 110a to control the operating states of the transistors 101a and 102a in accordance with an instruction given from the outside and supplies the signals to the level shifter 111.

The level shifter 111 generates a signal having the voltage Vout1 and a signal having the voltage Vout2 for controlling the switching of the transistors 107a to 110a by regulating the voltage of the signals from the input device 112 with the use of the voltage VH and the voltage VL. In FIG. 7, a signal having a voltage Vout1 of +170 V or −170 V is supplied to the gate electrodes of the transistors 107a and 109a, and a signal having a voltage Vout2 of +170 V or −170 V is supplied to the gate electrodes of the transistors 108a and 110a.

The voltage VH of +170 V is applied to one of a source terminal and a drain terminal of each of the transistors 107a and 109a. In the case where the voltage Vout1 of +170 V is applied to the gate electrodes of the transistors 107a and 109a, the transistors 107a and 109a are turned on, and voltage that is lower than +170 V by the threshold voltage of the transistors 107a and 109a is applied to the gate electrodes of the transistors 101a and 102a and the capacitors 114 and 115. In the case where the voltage Vout1 of −170 V is applied to the gate electrodes of the transistors 107a and 109a, the transistors 107a and 109a are turned off, and the voltage of the gate electrodes of the transistors 101a and 102a is held by the capacitors 114 and 115.

The voltage VL of −170 V is applied to one of a source terminal and a drain terminal of each of the transistors 108a and 110a. In the case where the voltage Vout1 of +170 V is applied to the gate electrodes of the transistors 108a and 110a, the transistors 108a and 110a are turned on, and the voltage VL of −170 V is applied to the gate electrodes of the transistors 101a and 102a and the capacitors 114 and 115. In the case where the voltage Vout1 of −170 V is applied to the gate electrodes of the transistors 108a and 110a, the transistors 108a and 110a are turned off, and the voltage of the gate electrodes of the transistors 101a and 102a is held by the capacitors 114 and 115.

AC voltage is applied from the AC power supply 116a to one of a source terminal and a drain terminal of each of the transistors 101a and 102a. In FIG. 7, the AC power supply 116a is a commercial power supply, and an AC voltage of ±141 V is applied to one of the source terminal and the drain terminal of each of the transistors 101a and 102a. Thus, when the voltage that is lower than the voltage VH of +170 V by the threshold voltage of the transistors 107a and 109a is applied to the gate electrodes of the transistors 101a and 102a, the transistors 101a and 102a are turned on. Then, through the transistors 101a and 102a that are on, the voltage output from the AC power supply 116a is applied to the voltage regulator 103. When the voltage VL of −170 V is applied to the gate electrodes of the transistors 101a and 102a, the transistors 101a and 102a are turned off.

Note that in one embodiment of the present invention, after the transistors 107a and 109a are turned on, the voltage that is lower than the voltage VH of +170 V by the threshold voltage of the transistors 107a and 109a is applied to the gate electrodes of the transistors 101a and 102a, and the transistors 107a and 109a are turned off, even when the voltage of one of the source terminal and the drain terminal of each of the transistors 107a and 109a is slightly lowered, the transistors 107a and 109a can be kept off. Further, in one embodiment of the present invention, since the off-state current of the transistors 107a to 110a is extremely low, the transistors 101a and 102a can be kept on when the transistors 107a and 109a are off. Thus, in one embodiment of the present invention, even when generation of the voltage VH for determining the operating states of the transistors 101a and 102a is stopped in the positive voltage generation circuit 122, the operating states of the transistors 101a and 102a can be kept. Consequently, the power consumption of the voltage generation circuit 106 can be reduced, and the power consumption of the power supply circuit 100 can be reduced.

The voltage regulator 103 regulates AC voltage applied from the AC power supply 116a through the transistors 101a and 102a that are on. In FIG. 7, the voltage regulator 103 generates a voltage (DC voltage) of +12 V by rectifying and smoothing an AC voltage of ±141 V and then stepping the AC voltage down. The voltage regulated in the voltage regulator 103 is applied to the load 117 and the electric storage device 104 in the control circuit 113.

The electric storage device 104 stores power with the use of applied voltage. After the electric storage device 104 stores power sufficiently, voltage output from the electric storage portion 125 is applied to the positive voltage generation circuit 122 and the negative voltage generation circuit 123 through the diode 126. The voltage applied from the electric storage portion 125 is stepped down by the diode 126. In FIG. 7, a voltage of +12 V is output from the electric storage portion 125, a voltage of +11.3 V is output from a cathode of the diode 126, and the voltage of +11.3 V is applied to the positive voltage generation circuit 122 and the negative voltage generation circuit 123.

Note that when the voltage of +11.3 V is output from the cathode of the diode 126, the voltage of the cathode of the diode 127 is higher than that of an anode of the diode 127; thus, current does not flow through the diode 127. Accordingly, supply of voltage from the auxiliary power supply 105 to the voltage generation circuit 106 is stopped.

The voltage generation circuit 106 performs the above operation, specifically, generation of the voltage VH and the voltage VL with the use of the voltage applied from the electric storage device 104.

Figure 8:
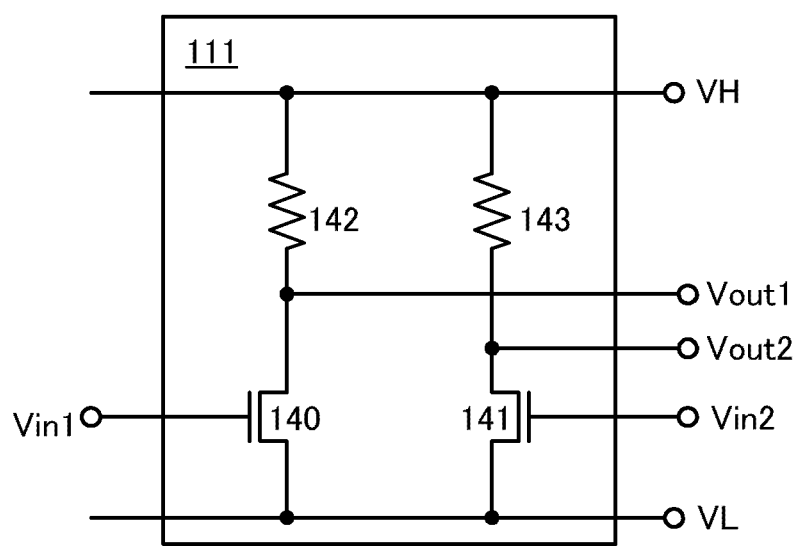
FIG. 8 illustrates a structure of a level shifter.

Next, an example of a specific circuit structure of the level shifter 111 is described. FIG. 8 illustrates an example of a circuit structure of the level shifter 111 in FIG. 6 and FIG. 7.

The level shifter 111 in FIG. 8 includes transistors 140 and 141 and resistors 142 and 143. One of a source terminal and a drain terminal of the transistor 140 is connected to a node to which the voltage VL is applied. The other of the source terminal and the drain terminal of the transistor 140 is connected to a second terminal of the resistor 142. The voltage Vin1 of a signal is output from the input device 112 to a gate electrode of the transistor 140. One of a source terminal and a drain terminal of the transistor 141 is connected to the node to which the voltage VL is applied. The other of the source terminal and the drain terminal of the transistor 141 is connected to a second terminal of the resistor 143. The voltage Vin2 of a signal is output from the input device 112 to a gate electrode of the transistor 141. A first terminal of the resistor 142 and a first terminal of the resistor 143 are connected to a node to which the voltage VH is applied.

Voltage applied to the other of the source terminal and the drain terminal of the transistor 140 and the second terminal of the resistor 142 is output from the level shifter 111 as the voltage Vout1. Further, voltage applied to the other of the source terminal and the drain terminal of the transistor 141 and the second terminal of the resistor 143 is output from the level shifter 111 as the voltage Vout2.

For example, when the voltage Vin1 is at a high level, the transistor 140 is turned on; thus, the voltage VL is output from the level shifter 111 as the voltage Vout1. In addition, when the voltage Vin1 is at a low level, the transistor 140 is turned off; thus, the voltage VH is output from the level shifter 111 as the voltage Vout1. When the voltage Vin2 is at a high level, the transistor 141 is turned on; thus, the voltage VL is output from the level shifter 111 as the voltage Vout1. In addition, when the voltage Vin2 is at a low level, the transistor 141 is turned off; thus, the voltage VH is output from the level shifter 111 as the voltage Vout1.

This embodiment can be combined with any of the other embodiments as appropriate.

(Embodiment 3)

Figure 9:
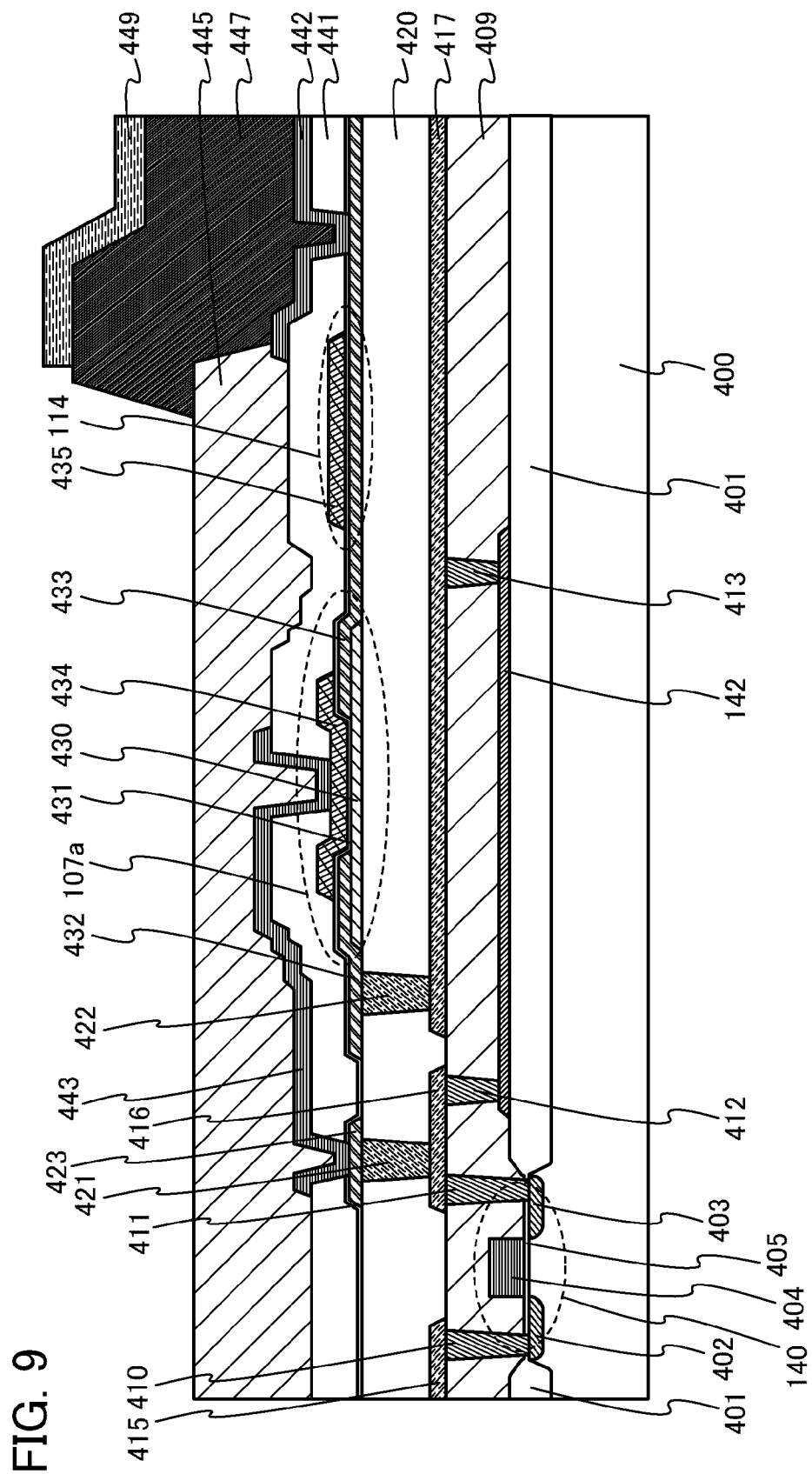
FIG. 9 is a cross-sectional view of a power supply circuit.

FIG. 9 illustrates an example of part of a cross-sectional structure of a power supply circuit according to one embodiment of the present invention. Note that FIG. 9 illustrates the transistor 107a and the capacitor 114 in FIG. 6 and the transistor 140 and the resistor 142 in FIG. 8.

In this embodiment, the transistor 140 and the resistor 142 are formed in a single crystal silicon substrate, and the transistor 107a including an oxide semiconductor in an active layer and the capacitor 114 are formed above the transistor 140 and the resistor 142. The transistor 140 may include a thin semiconductor film of silicon, germanium, or the like in an amorphous, microcrystalline, polycrystalline, or signal crystal state for an active layer. Alternatively, the transistor 140 may include an oxide semiconductor in the active layer. In the case where the transistors each include an oxide semiconductor in an active layer, the transistor 107a is not necessarily stacked above the transistor 140, and the transistors 107a and 140 may be formed in the same layer.

In the case where the transistor 140 is formed using a thin silicon film, any of the following can be used: amorphous silicon formed by sputtering or vapor phase growth such as plasma-enhanced CVD; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

In FIG. 9, the n-channel transistor 140 is formed in a semiconductor substrate 400.

The semiconductor substrate 400 can be, for example, a silicon substrate having n-type or p-type conductivity, a germanium substrate, a silicon germanium substrate, or a compound semiconductor substrate (e.g., a GaAs substrate, an InP substrate, a GaN substrate, a SiC substrate, a GaP substrate, a GaInAsP substrate, or a ZnSe substrate). In FIG. 9, a single crystal silicon substrate having n-type conductivity is used.

The transistor 140 is electrically isolated from, for example, another transistor in FIG. 8, such as the transistor 141, by an element isolation insulating film 401. The element isolation insulating film 401 can be formed by a local oxidation of silicon (LOCOS) method, a trench isolation method, or the like.

Specifically, the transistor 140 includes impurity regions 402 and 403 that are formed in the semiconductor substrate 400 and function as a source region and a drain region, a gate electrode 404, and a gate insulating film 405 provided between the semiconductor substrate 400 and the gate electrode 404. The gate electrode 404 overlaps with a channel formation region formed between the impurity regions 402 and 403 with the gate insulating film 405 positioned between the gate electrode 404 and the channel formation region.

The resistor 142 is provided over the element isolation insulating film 401. A semiconductor film including polycrystalline, microcrystalline, or amorphous silicon can be used for the resistor 142, for example.

An insulating film 409 is provided over the transistor 140. Openings are formed in the insulating film 409. Wirings 410 and 411 that are in contact with the impurity regions 402 and 403, respectively, and wirings 412 and 413 that are in contact with the resistor 142 are formed in the openings.

The wiring 410 is connected to a wiring 415 formed over the insulating film 409. The wirings 411 and 412 are connected to a wiring 416 formed over the insulating film 409. The wiring 413 is connected to a wiring 417 formed over the insulating film 409.

An insulating film 420 is formed over the wirings 415 to 417. Openings are formed in the insulating film 420. In the openings, a wiring 421 connected to the wiring 416 and a wiring 422 connected to the wiring 417 are formed.

In FIG. 9, the transistor 107a and the capacitor 114 are formed over the insulating film 420.

The transistor 107a includes, over the insulating film 420, a semiconductor film 430 containing an oxide semiconductor, conductive films 432 and 433 that are positioned over the semiconductor film 430 and function as a source electrode and a drain electrode, a gate insulating film 431 over the semiconductor film 430 and the conductive films 432 and 433, and a gate electrode 434 that is positioned over the gate insulating film 431 and overlaps with the semiconductor film 430 between the conductive films 432 and 433.

A conductive film 423 is provided over the insulating film 420 and is in contact with the wiring 421. The conductive film 432 is in contact with the wiring 422.

A conductive film 435 is provided over the gate insulating film 431 to overlap with the conductive film 433. A portion where the conductive films 433 and 435 overlap with each other with the gate insulating film 431 positioned therebetween functions as the capacitor 114.

Note that in FIG. 9, the capacitor 114 is provided over the insulating film 420 together with the transistor 107a. However, the capacitor 114 may be provided below the insulating film 420 together with the transistor 140.

An insulating film 441 is provided over the transistor 107a, the capacitor 114, and the conductive film 423. Openings are provided in the insulating film 441 and the gate insulating film 431. Over the insulating film 441, a conductive film 442 that is in contact with the conductive film 433 through the opening and a conductive film 443 that is in contact with the gate electrode 434 and the conductive film 423 through the opening are provided.

An insulating film 445 is provided over the insulating film 441 and the conductive films 442 and 443. An opening is provided in the insulating film 445. Over the insulating film 445, a conductive film 447 that is in contact with the conductive film 442 through the opening is provided. The conductive film 447 preferably has high surface flatness to be connected to the gate electrode of the transistor 101a in FIG. 6 later. Thus, a resin in which conductive particles are dispersed is suitable for the material of the conductive film 447. Note that the resin has low adhesion to a solder; thus, over the conductive film 447, a conductive film 449 is formed using a conductive material having high adhesion to a solder to be in contact with the conductive film 447.

Note that in FIG. 9, the transistor 107a includes the gate electrode 434 on at least one side of the semiconductor film 430. Alternatively, the transistor 107a may include a pair of gate electrodes with the semiconductor film 430 positioned therebetween.

When the transistor 107a includes a pair of gate electrodes with the semiconductor film 430 positioned therebetween, a signal for controlling an on state or an off state may be supplied to one of the gate electrodes, and the other of the gate electrodes may be electrically isolated (floating) or may be supplied with a potential from another element. In the latter case, potentials at the same level may be supplied to the pair of electrodes, or a fixed potential such as a ground potential may be supplied only to the other of the gate electrodes. By controlling the level of a potential applied to the other of the gate electrodes, the threshold voltage of the transistor can be controlled.

An oxide semiconductor preferably contains at least indium (In) or zinc (Zn). As a stabilizer for reducing variations in electrical characteristics of a transistor including the oxide semiconductor, the oxide semiconductor preferably contains gallium (Ga) in addition to In and Zn. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

For example, indium oxide; gallium oxide; tin oxide; zinc oxide; a binary metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a ternary metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; or a quaternary metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used as an oxide semiconductor.

Note that, for example, an In—Ga—Zn-based oxide means an oxide containing In, Ga, and Zn, and there is no limitation on the ratio of In, Ga, and Zn. In addition, the In—Ga—Zn-based oxide may contain a metal element other than In, Ga, and Zn. The In—Ga—Zn-based oxide has sufficiently high resistance when no electric field is applied thereto, so that off-state current can be sufficiently reduced. Further, the In—Ga—Zn-based oxide has high mobility.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide whose composition is in the neighborhood of the above composition can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide whose composition is in the neighborhood of the above composition is preferably used.

For example, with an In—Sn—Zn-based oxide, high mobility can be comparatively easily obtained. However, even with an In—Ga—Zn-based oxide, mobility can be increased by lowering defect density in a bulk.

The structure of an oxide semiconductor film is described below.

An oxide semiconductor film is roughly classified into a single-crystal oxide semiconductor film and a non-single-crystal oxide semiconductor film. The non-single-crystal oxide semiconductor film means any of an amorphous oxide semiconductor film, a microcrystalline oxide semiconductor film, a polycrystalline oxide semiconductor film, a c-axis aligned crystalline oxide semiconductor (CAAC-OS) film, and the like.

The microcrystalline oxide semiconductor film includes a microcrystal (also referred to as nanocrystal) of greater than or equal to 1 nm and less than 10 nm, for example. Thus, the microcrystalline oxide semiconductor film has higher degree of atomic order than the amorphous oxide semiconductor film. Hence, the density of defect states of the microcrystalline oxide semiconductor film is lower than that of the amorphous oxide semiconductor film.

The amorphous oxide semiconductor film has disordered atomic arrangement and no crystalline component. A typical example the amorphous oxide semiconductor film is an oxide semiconductor film in which no crystal part exists even in a microscopic region, and the whole of the film is amorphous.

The CAAC-OS film is one of oxide semiconductor films including a plurality of crystal parts, and most of the crystal parts each fit into a cube whose one side is less than 100 nm. Thus, there is a case where a crystal part included in the CAAC-OS film fits into a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC- OS film, a reduction in electron mobility due to the grain boundary is less likely to occur.

In this specification, a term "perpendicular" indicates that an angle formed between two straight lines is 80 to 100°, and accordingly includes the case where the angle is 85 to 95°. In addition, a term "parallel" indicates that an angle formed between two straight lines is −10 to 10°, and accordingly includes the case where the angle is −5 to 5°.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (planar TEM image), metal atoms are arranged in a triangular or hexagonal configuration in the crystal parts. However, there is no regularity of arrangement of metal atoms between different crystal parts.

From the results of the cross-sectional TEM image and the planar TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer which is arranged in a layered manner and observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where the shape of the CAAC-OS film is changed by etching or the like, the c-axis might not be necessarily parallel to a normal vector of a formation surface or a normal vector of a top surface of the CAAC-OS film.

Further, the crystallinity in the CAAC-OS film is not necessarily uniform. For example, in the case where crystal growth leading to the CAAC-OS film occurs from the vicinity of the top surface of the film, the crystallinity in the vicinity of the top surface is higher than that in the vicinity of the formation surface in some cases. Further, when an impurity is added to the CAAC-OS film, the crystallinity in a region to which the impurity is added is changed, and the crystallinity in the CAAC-OS film varies depending on regions.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

With the use of the CAAC-OS film in a transistor, changes in electrical characteristics of the transistor due to irradiation with visible light or ultraviolet light is small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

For example, a CAAC-OS film is deposited by sputtering with a polycrystalline metal oxide target. When ions collide with the target, a crystal region included in the target may be separated from the target along the a-b plane, and a sputtered particle having a plane parallel to the a-b plane (a flat-plate-like sputtered particle or a pellet-like sputtered particle) might be separated from the target. In that case, the flat-plate-like sputtered particle reaches a substrate while maintaining its crystal state, so that the CAAC-OS film can be deposited.

For the deposition of the CAAC-OS film, the following conditions are preferably employed.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in a treatment chamber may be reduced. Further, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle occurs after the sputtered particle reaches the substrate. Specifically, the substrate heating temperature during the deposition is 100 to 740° C., preferably 200 to 500° C. By increasing the substrate heating temperature during the deposition, when the flat-plate-like sputtered particle reaches the substrate, migration occurs on the substrate, so that a flat plane of the sputtered particle is attached to the substrate.

Further, it is preferable to reduce plasma damage during the deposition by increasing the proportion of oxygen in the deposition gas and optimizing power. The proportion of oxygen in the deposition gas is 30 vol % or higher, preferably 100 vol %.

As an example of the target, an In—Ga—Zn-based oxide target is described below.

A polycrystalline In—Ga—Zn-based oxide target is made by mixing $InO_X$ powder, $GaO_Y$ powder, and $ZnO_Z$ powder in a predetermined mole ratio, applying pressure, and performing heat treatment at 1000 to 1500° C. Note that X, Y, and Z are each a given positive number. Here, the predetermined mole ratio of the $InO_X$ powder, the $GaO_Y$ powder, and the $ZnO_Z$ powder is, for example, 2:2:1, 8:4:3, 3:1:1, 1:1:1, 4:2:3, or 3:1:2. The kinds of powder and the mole ratio for mixing powder may be changed as appropriate depending on a target to be formed.

This embodiment can be combined with any of the other embodiments as appropriate.

(Embodiment 4)

Next, structure examples of transistors each including an oxide semiconductor film for an active layer are described.

Figure 10A:
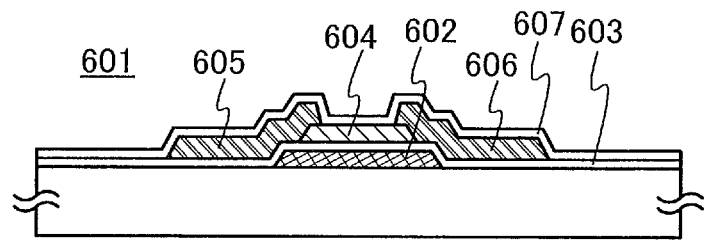
FIGS. 10A to 10D are cross-sectional views of transistors.

A transistor 601 in FIG. 10A is a bottom-gate transistor with a channel-etched structure.

The transistor 601 includes a gate electrode 602 formed over an insulating surface, a gate insulating film 603 over the gate electrode 602, an oxide semiconductor film 604 over the gate insulating film 603 that functions as an active layer and overlaps with the gate electrode 602, and conductive films 605 and 606 formed over the oxide semiconductor film 604. The transistor 601 may further include an insulating film 607 formed over the oxide semiconductor film 604 and the conductive films 605 and 606.

Note that the transistor 601 in FIG. 10A may further include a gate electrode formed over the insulating film 607 in a position that overlaps with the oxide semiconductor film 604.

Figure 10B:
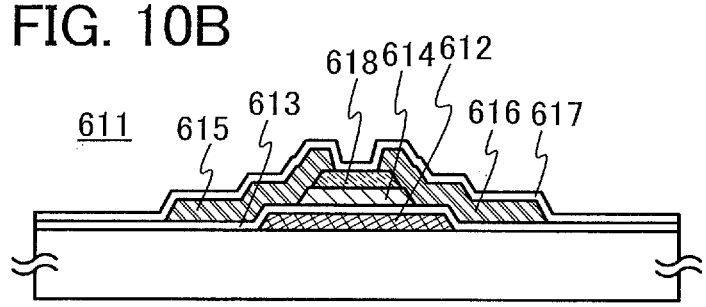

A transistor 611 in FIG. 10B is a bottom-gate transistor with a channel-protective structure.

The transistor 611 includes a gate electrode 612 formed over an insulating surface, a gate insulating film 613 over the gate electrode 612, an oxide semiconductor film 614 over the gate insulating film 613 that functions as an active layer and overlaps with the gate electrode 612, a channel protective film 618 formed over the oxide semiconductor film 614, and conductive films 615 and 616 formed over the oxide semiconductor film 614. The transistor 611 may further include an insulating film 617 formed over the channel protective film 618 and the conductive films 615 and 616.

Note that the transistor 611 in FIG. 10B may further include a gate electrode formed over the insulating film 617 in a position that overlaps with the oxide semiconductor film 614.

The channel protective film 618 can prevent a portion of the oxide semiconductor film 614 that serves as a channel formation region from being damaged in a later step, for example, a reduction in thickness due to plasma or an etchant during etching. Thus, the reliability of the transistor 611 can be improved.

Figure 10C:
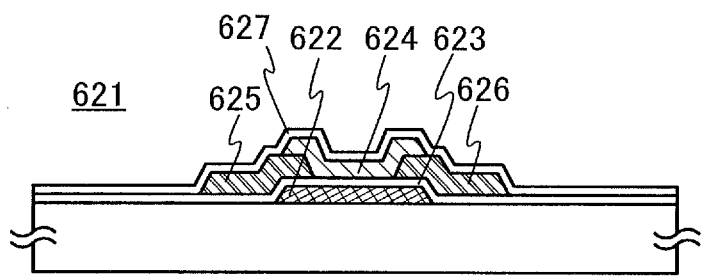

A transistor 621 in FIG. 10C is a bottom-gate transistor with a bottom-contact structure.

The transistor 621 includes a gate electrode 622 over an insulating surface, a gate insulating film 623 over the gate electrode 622, conductive films 625 and 626 over the gate insulating film 623, and an oxide semiconductor film 624 over the gate insulating film 623 that overlaps with the gate electrode 622, is formed over the conductive films 625 and 626, and functions as an active layer. The transistor 621 may further include an insulating film 627 formed over the conductive films 625 and 626 and the oxide semiconductor film 624.

Note that the transistor 621 in FIG. 10C may further include a gate electrode formed over the insulating film 627 in a position that overlaps with the oxide semiconductor film 624.

Figure 10D:
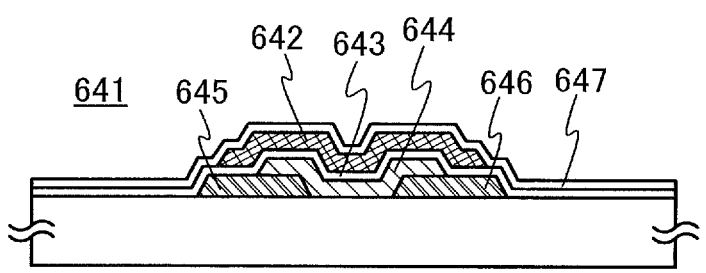

A transistor 641 in FIG. 10D is a top-gate transistor with a bottom-contact structure.

The transistor 641 includes conductive films 645 and 646 over an insulating surface, an oxide semiconductor film 644 over the conductive films 645 and 646 that functions as an active layer, a gate insulating film 643 formed over the oxide semiconductor film 644 and the conductive films 645 and 646, and a gate electrode 642 over the gate insulating film 643 that overlaps with the oxide semiconductor film 644. The transistor 641 may further include an insulating film 647 formed over the gate electrode 642.

This embodiment can be combined with any of the other embodiments as appropriate.

(Embodiment 5)

Next, structure examples of transistors each including gallium oxide in an active layer are described.

Figure 11A:
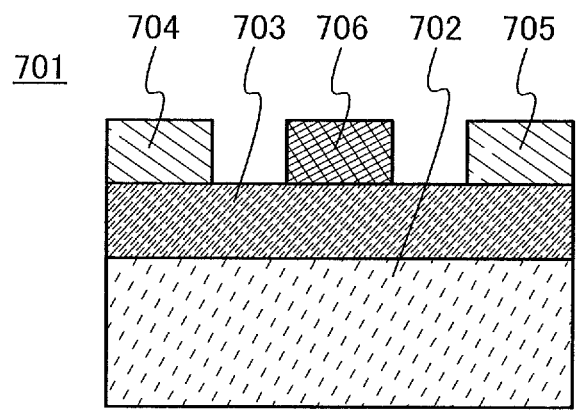
FIGS. 11A and 11B are cross-sectional views of transistors.

A transistor 701 in FIG. 11A is a MES field-effect transistor (MESFET). Specifically, in the transistor 701, over a gallium oxide substrate 702 containing $\beta$-$Ga_2O_3$, a gallium oxide film 703 containing $\beta$-$Ga_2O_3$ that is made to have n-type conductivity by addition of tin is provided. Over the gallium oxide film 703, conductive films 704 and 705 that function as a source electrode and a drain electrode, and a gate electrode 706 positioned between the conductive films 704 and 705 are provided.

For the conductive films 704 and 705, metal which forms ohmic contact with the gallium oxide film 703 is used. For example, for the conductive film 704 or 705, aluminum, nickel, or titanium can be used. For the gate electrode 706, metal which forms Schottky barrier junction with the gallium oxide film 703 is used. For example, for the gate electrode 706, gold, gold-germanium, platinum, or tungsten nitride can be used.

Figure 11B:
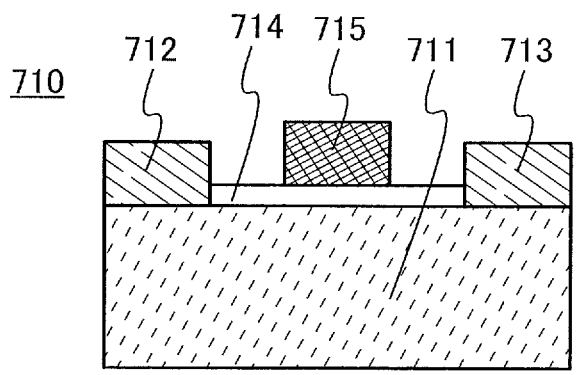

A transistor 710 in FIG. 11B is a MOS field-effect transistor (MOSFET). Specifically, in the transistor 710, over a gallium oxide substrate 711 containing $\beta$-$Ga_2O_3$, conductive films 712 and 713 that function as a source electrode and a drain electrode, and a gate insulating film 714 positioned between the conductive films 712 and 713 are provided. Over the gate insulating film 714, a gate electrode 715 positioned between the conductive films 712 and 713 is provided.

For the conductive film 712 or 713, or the gate electrode 715, like the conductive films 704 and 705, aluminum, nickel, titanium, or the like can be used. For example, for the gate insulating film 714, aluminum oxide or silicon oxide can be used.

This embodiment can be combined with any of the other embodiments as appropriate.

(Embodiment 6)

Figure 12A:
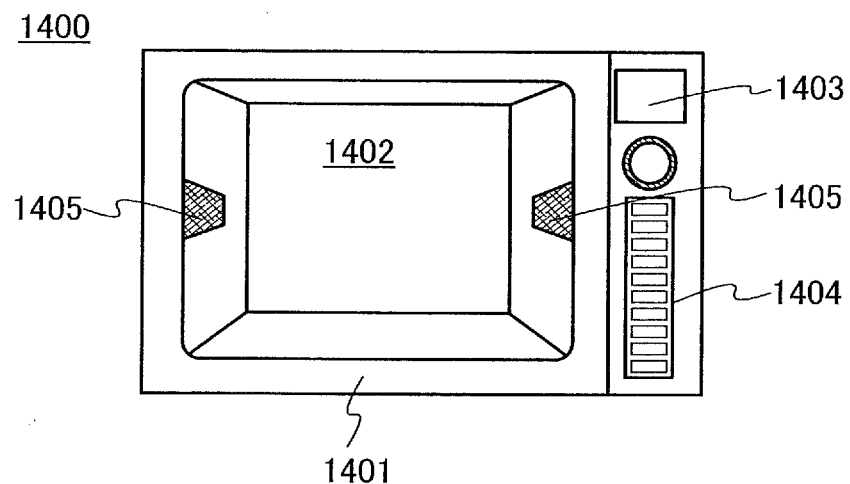
FIGS. 12A and 12B illustrate electronic devices.
Figure 12B:
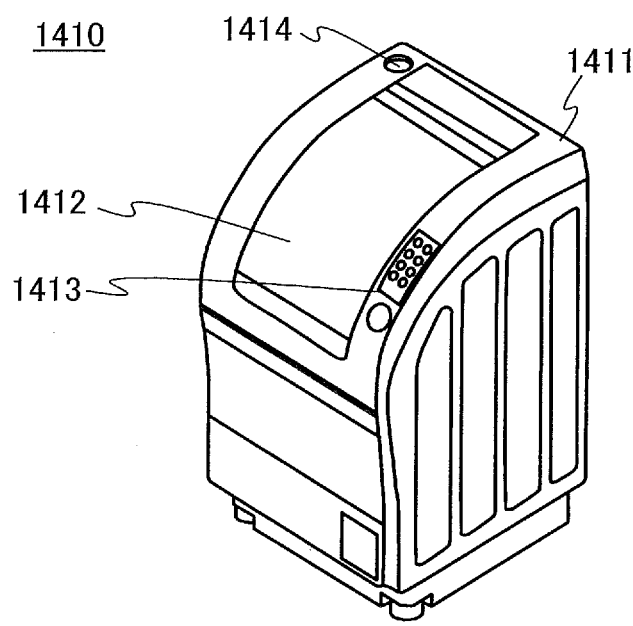

The power supply circuit according to one embodiment of the present invention can be used for display devices, personal computers, or image reproducing devices provided with recording media (typically, devices which reproduce the content of recording media such as digital versatile discs (DVDs) and have displays for displaying the reproduced images). Further, as electronic devices which can include the power supply circuit according to one embodiment of the present invention, cellular phones, game machines (including portable game machines), portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATMs), vending machines, high-frequency heating apparatuses such as microwave ovens, electric rice cookers, electric washing machines, air-conditioning systems such as air conditioners, electric refrigerators, electric freezers, electric refrigerator-freezers, electric sewing machines, electric tools, semiconductor testing devices, and the like can be given. The power supply circuit according to one embodiment of the present invention may be a moving object powered by an electric motor. The moving object is a motor vehicle (a motorcycle or an ordinary motor vehicle with three or more wheels), a motor-assisted bicycle including an electric bicycle, an airplane, a vessel, a rail car, or the like. FIGS. 12A and 12B illustrate specific examples of these electronic devices.

FIG. 12A illustrates a microwave oven 1400, which includes a housing 1401, a treatment room 1402 for placing an object, a display portion 1403, an input device (e.g., an operating panel) 1404, and an irradiation portion 1405 supplying an electromagnetic wave generated from a high-frequency wave generator provided in the housing 1401 to the treatment room 1402. The power supply circuit according to one embodiment of the present invention can be used, for example, to control supply of power to the high-frequency wave generator.

FIG. 12B illustrates a washing machine 1410, which includes a housing 1411, a cover 1412 over a washing tub provided in the housing 1411, an input device (e.g., an operating panel) 1413, and a water inlet 1414 of the washing tub. The power supply circuit according to one embodiment of the present invention can be used, for example, to control supply of power to a motor controlling rotation of the washing tub.

This embodiment can be combined with any of the other embodiments as appropriate.
(Embodiment 7)

Next, a method for forming a MOS field-effect transistor (MOSFET) including an oxide semiconductor film in a channel formation region over a gallium oxide substrate is described.

Figure 13A:
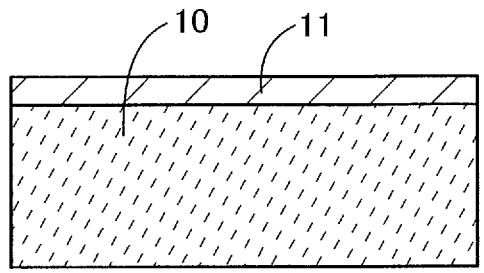
FIGS. 13A to 13D illustrate a method for forming a transistor.

First, as illustrated in FIG. 13A, an oxide semiconductor film 11 containing an In—Zn-based oxide is formed over a gallium oxide substrate 10. A substrate containing β-Ga$_2$O$_3$ that has the most stable structure can be used as the gallium oxide substrate 10. The oxide semiconductor film 11 can be formed by sputtering or the like. The thickness of the oxide semiconductor film 11 is, for example, 3 to 500 nm, preferably 3 to 50 nm.

Figure 13B:
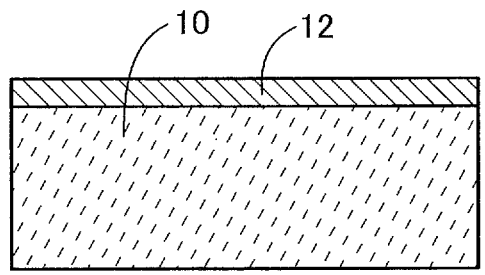

Then, by performing heat treatment on the gallium oxide substrate 10 and the oxide semiconductor film 11, gallium is diffused from the gallium oxide substrate 10 into the oxide semiconductor film 11. Note that indium and zinc in the oxide semiconductor film 11 may be diffused into the gallium oxide substrate 10. By the heat treatment, an oxide semiconductor film 12 containing an In—Ga—Zn-based oxide is formed (FIG. 13B). By performing the heat treatment in a reduced-pressure atmosphere, an inert gas atmosphere of nitrogen, a rare gas, or the like, an oxygen atmosphere, or ultra dry air (the moisture amount is 20 ppm (−55° C. by conversion into a dew point) or less, preferably 1 ppm or less, more preferably 10 ppb or less, in the case where measurement is performed by a dew point meter in a cavity ring-down laser spectroscopy (CRDS) method), impurities such as moisture or hydrogen in the oxide semiconductor film 12 can be eliminated, which is preferable. Further, the temperature of the heat treatment may be 500 to 1750° C.

Figure 13C:
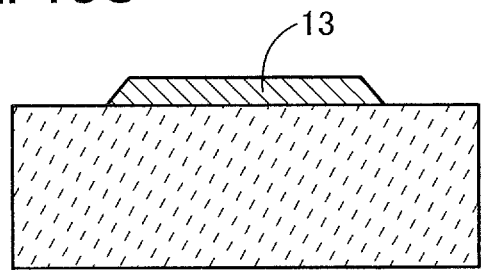

Next, as illustrated in FIG. 13C, the oxide semiconductor film 12 is processed into a desired shape by etching or the like, so that an oxide semiconductor film 13 is formed.

Figure 13D:
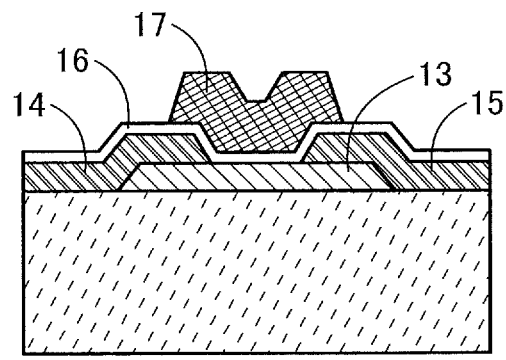

Then, conductive films 14 and 15 are formed over the oxide semiconductor film 13. After that, a gate insulating film 16 is formed to cover the oxide semiconductor film 13 and the conductive films 14 and 15. Next, a conductive film 17 is formed over the gate insulating film 16 in a position that overlaps with the oxide semiconductor film 13; thus, the transistor can be formed as illustrated in FIG. 13D.

This application is based on Japanese Patent Application serial No. 2012-102126 filed with Japan Patent Office on Apr. 27, 2012, the entire contents of which are hereby incorporated by reference.

What is claimed is:

1. A power supply circuit comprising:
a first switch comprising a first transistor;
a voltage regulator circuit connected to the first switch; and
a control circuit for controlling the first switch, the control circuit comprising:
an electric storage device connected to the voltage regulator circuit;
a voltage generation circuit comprising a first output terminal and a second output terminal;
a second switch comprising a second transistor; and
a third switch comprising a third transistor,
wherein the first transistor includes a semiconductor having a wider band gap than silicon,
wherein the electric storage device is connected to the voltage generation circuit at a first node so that power stored in the electric storage device is supplied to the voltage generation circuit,
wherein the first output terminal is connected to the first switch through the second switch at a second node, and
wherein the second output terminal is connected to the first switch through the third switch at the second node.

2. The power supply circuit according to claim 1, wherein the semiconductor comprises gallium oxide.

3. The power supply circuit according to claim 1, wherein the semiconductor comprises indium, gallium, and zinc.

4. The power supply circuit according to claim 1,
wherein each of the second transistor and the third transistor includes a semiconductor comprising gallium oxide.

5. The power supply circuit according to claim 4,
wherein the control circuit further comprises an auxiliary power supply connected to the voltage generation circuit at the first node.

6. The power supply circuit according to claim 1,
wherein each of the second transistor and the third transistor includes a semiconductor comprising indium, gallium, and zinc.

7. The power supply circuit according to claim 6,
wherein the control circuit further comprises an auxiliary power supply connected to the voltage generation circuit at the first node.

8. A power supply circuit comprising:
a first switch comprising a first transistor;
a second switch comprising a second transistor;
a voltage regulator circuit connected to the first switch and the second switch; and
a control circuit for controlling the first switch and the second switch, the control circuit comprising:
an electric storage device connected to the voltage regulator circuit;
a voltage generation circuit comprising a first output terminal and a second output terminal;
a third switch comprising a third transistor;
a fourth switch comprising a fourth transistor;
a fifth switch comprising a fifth transistor; and
a sixth switch comprising a sixth transistor,
wherein each of the first transistor and the second transistor includes a semiconductor having a wider band gap than silicon, wherein the electric storage device is connected to the voltage generation circuit at a first node so that power stored in the electric storage device is supplied to the voltage generation circuit, wherein the first output terminal is connected to the first switch through the third switch at a second node, and is connected to the second switch through the fifth switch at a third node, wherein the second output terminal is connected to the first switch through the fourth switch at the second node, and is connected to the second switch through the sixth switch at the third node.

9. The power supply circuit according to claim 8, wherein the semiconductor comprises gallium oxide.

10. The power supply circuit according to claim 8, wherein the semiconductor comprises indium, gallium, and zinc.

11. The power supply circuit according to claim 8,
wherein each of the third transistor, the fourth transistor, the fifth transistor, and the sixth transistor includes a semiconductor comprising gallium oxide.

12. The power supply circuit according to claim 11,
wherein the control circuit further comprises an auxiliary power supply connected to the voltage generation circuit at the first node.

13. The power supply circuit according to claim 8,
wherein each of the third transistor, the fourth transistor, the fifth transistor, and the sixth transistor includes a semiconductor comprising indium, gallium, and zinc.

14. The power supply circuit according to claim 13,
wherein the control circuit further comprises an auxiliary power supply connected to the voltage generation circuit at the first node.

15. A power supply circuit comprising:
a first switch comprising a first transistor;
a voltage regulator circuit connected to the first switch; and
a control circuit for controlling the first switch, the control circuit comprising:
  an electric storage device connected to the voltage regulator circuit;
  a voltage generation circuit comprising a first output terminal and a second output terminal;
  a second switch comprising a second transistor; and
  a third switch comprising a third transistor,
wherein the electric storage device is connected to the voltage generation circuit at a first node so that power stored in the electric storage device is supplied to the voltage generation circuit,
wherein the first output terminal is connected to the first switch through the second switch at a second node, and
wherein the second output terminal is connected to the first switch through the third switch at the second node.

16. The power supply circuit according to claim 15, further comprising a fourth switch comprising a fourth transistor,
wherein the control circuit further comprises:
  a fifth switch comprising a fifth transistor;
  a sixth switch comprising a sixth transistor; and
wherein the first output terminal is connected to the fourth switch through the fifth switch at a third node,
wherein the second output terminal is connected to the fourth switch through the sixth switch at the third node.

17. The power supply circuit according to claim 15,
wherein the control circuit further comprises an auxiliary power supply connected to the voltage generation circuit at the first node.

* * * * *